United States Patent
Katta

(10) Patent No.: US 7,142,072 B2
(45) Date of Patent: Nov. 28, 2006

(54) VARIABLE MATCHING CIRCUIT, VARIABLE RESONANCE CIRCUIT, VARIABLE PHASE-SHIFTING CIRCUIT AND VARIABLE ATTENUATION CIRCUIT EACH HAVING VARIABLE-CAPACITANCE CAPACITOR

(75) Inventor: Hiroshi Katta, Kyoto (JP)

(73) Assignee: Kyocera Corporation, Kyoto (JP)

( * ) Notice: Subject to any disclaimer, the term of this patent is extended or adjusted under 35 U.S.C. 154(b) by 85 days.

(21) Appl. No.: 10/946,648

(22) Filed: Sep. 21, 2004

(65) Prior Publication Data

US 2005/0104680 A1 May 19, 2005

(30) Foreign Application Priority Data

| Sep. 22, 2003 | (JP) | ............................ P2003-330597 |
| Oct. 29, 2003 | (JP) | ............................ P2003-369108 |
| Dec. 17, 2003 | (JP) | ............................ P2003-420165 |
| Feb. 17, 2004 | (JP) | ............................ P2004-040044 |

(51) Int. Cl.
*H03H 7/38* (2006.01)

(52) U.S. Cl. ........................................ 333/32; 333/172
(58) Field of Classification Search .................. 333/32, 333/172
See application file for complete search history.

(56) References Cited

U.S. PATENT DOCUMENTS 5,990,761 A 11/1999 Hamparian et al.
6,100,773 A 8/2000 Nakamichi et al.
6,130,589 A 10/2000 Yamaguchi et al.
6,377,440 B1 * 4/2002 Zhu et al. .................... 361/311
6,674,321 B1 1/2004 York

FOREIGN PATENT DOCUMENTS

| JP | 6-177694 | 6/1994 |
| JP | 10-335903 | 12/1998 |
| JP | 10-335980 | 12/1998 |
| JP | 11-111566 | 4/1999 |
| JP | 2002-528899 | 9/2002 |
| WO | 00/24079 | 4/2000 |
| WO | 03/038996 | 5/2003 |

* cited by examiner

Primary Examiner—Stephen E. Jones
(74) Attorney, Agent, or Firm—Hogan & Hartson LLP

(57) ABSTRACT

In a variable matching circuit including an impedance device and a variable-capacitance capacitor, the variable-capacitance capacitor is formed in a manner that a plurality of variable-capacitance devices using thin film dielectric layers whose dielectric constants change depending on applied voltages are connected to each other in parallel regarding a direct current and connected to each other in series regarding a high frequency, between an input terminal and an output terminal. The variable matching circuit can be realized that can make the maximum use of the rate of a capacitance change of the variable-capacitance capacitor by a bias signal and make an impedance matching, that exhibits small waveform distortion and intermodulation distortion, and that is excellent in electric high power handling capability and low-loss even at a high frequency.

3 Claims, 19 Drawing Sheets

VARIABLE MATCHING CIRCUIT, VARIABLE RESONANCE CIRCUIT, VARIABLE PHASE-SHIFTING CIRCUIT AND VARIABLE ATTENUATION CIRCUIT EACH HAVING VARIABLE-CAPACITANCE CAPACITOR

BACKGROUND OF THE INVENTION

1. Field of the Invention

The present invention relates to a variable matching circuit that uses a variable capacitance capacitor having a dielectric layer whose dielectric constant changes depending on an applied voltage, and that is capable of making an impedance variable according to a capacitance change, as a matching circuit used in communication equipments such as mobile phones and high-frequency components installed in the communication equipments, and in particular, relates to a variable matching circuit that has excellent characteristics, for example, that is excellent in electric high power handling capability, low-distortion, and low-loss.

The present invention relates to a variable resonance circuit that uses a variable-capacitance capacitor having a dielectric layer whose dielectric constant changes depending on an applied voltage, and that is capable of making a resonance frequency variable according to a capacitance change, as a resonance circuit used in communication equipments such as mobile phones and high-frequency components installed in the communication equipments, and in particular, relates to a variable resonance circuit that has excellent characteristics, for example, that is excellent in electric high power handling capability, low-distortion, and low-loss.

The invention relates to a variable phase-shifting circuit that uses a variable-capacitance capacitor having a dielectric layer whose dielectric constant changes depending on an applied voltage and being capable of changing capacitance, and that is capable of changing a phase-shifting amount according to a capacitance change, as a phase-shitting circuit used in communication equipments of microwave bands and millimeter-wave bands and high-frequency components of phased array antennas, amplifiers and the like, and in particular, relates to a variable phase-shifting circuit that has excellent characteristics, for example, that is excellent in electric high power handling capability, low-distortion, and low-loss.

The invention relates to a variable attenuation circuit that uses a variable-capacitance capacitor having a dielectric layer whose dielectric constant changes depending on an applied voltage and being capable of changing capacitance, and that is capable of changing an attenuation amount according to a capacitance change, as an attenuation circuit used in communication equipments of microwave bands and millimeter-wave bands and high-frequency components of variable beam antennas, amplifiers and the like and attenuating signals, and in particular, relates to a variable attenuation circuit that has excellent characteristics, for example, that is excellent in electric high power handling capability, low-distortion, and easy to operate.

2. Description of the Related Art

In general, high-frequency components are designed to have input/output impedances of 50 Ω, and characteristics thereof are evaluated and guaranteed by a measurement system having a load impedance of 50 Ω. However, actually, the input/output impedances of the high-frequency components deviate from 50 Ω because of variations of used circuit components and wiring patterns. Therefore, for example, in the case of designing communication equipment using a plurality of high-frequency components, the high-frequency components are designed to have input/output impedances of 50 Ω, but there is a problem such that mismatching of the impedances occurs because of deviation of the input/output impedances of the high-frequency components from 50 Ω, or because of variations of the dimensions of the wiring patterns, interference and so on, and consequently, a characteristic desired for the communication equipment may not be obtained.

Accordingly, in order to control mismatching of the impedances among the high-frequency components, a countermeasure of, for example, using a matching circuit composed of impedance devices including a capacitor, a resistor, an inductor and a transmission line and replacing the impedance devices one by one is taken, whereby the impedances are regulated, and the desired characteristic is obtained.

Further, in the same way, when designing the high-frequency components, in order to obtain the desired characteristic, it is common to design on the assumption that the countermeasure of using a matching circuit composed of impedance devices including a capacitor, a resistor, an inductor and a transmission line and replacing the impedance devices one by one is taken to regulate the impedances and obtain the desired characteristic.

On the other hand, in the case of actually using mobile communication equipment such as a mobile terminal regulated so as to have a desired characteristic, there arises a problem such that an electromagnetic field in the communication equipment is disturbed under the influence of a human body holding the communication equipment when using, impedance mismatching occurs, and communication is hindered by deterioration in receiving sensitivity.

In order to solve these problems, a variable matching circuit made by combining impedance devices including a capacitor, a resistor, an inductor and a transmission line, and a variable-capacitance diode has been known since before.

Further, a variable matching circuit made by using a variable-capacitance capacitor instead of the variable-capacitance diode has been proposed (refer to Japanese Unexamined Patent Publications JP-A 10-335980 (1998) and JP-A 11-111566 (1999), for example).

However, the variable matching circuit using the variable-capacitance diode has a problem such that the variable matching circuit can be used only in a receiving apparatus and a receiving circuit that need small operation power, because the electric high power handling capability of the variable-capacitance diode is low and a distortion characteristic due to the nonlinearity of capacitance is large. In other words, there is a problem such that the variable matching circuit cannot be used in a transmission apparatus or a transmission circuit that need large operation power. Additionally, the variable matching circuit has a problem such that loss at a high frequency is large.

Further, in the variable matching circuit using the variable-capacitance capacitor as proposed in JP-A 10-335980 and JP-A 11 111566, a capacitance change of the variable-capacitance capacitor is caused also by a high-frequency voltage, so that the variable matching circuit has a problem such that distortion characteristics such as waveform distortion and intermodulation distortion become large when the high-frequency voltage is high. Moreover, in order to make the distortion characteristics small, it is necessary to decrease the high-frequency electric field strength of the variable-capacitance capacitor and reduce the capacitance change by the high-frequency voltage. It is effective therefor to increase the thickness of a dielectric layer. However, there is a problem such that direct current electric field strength is also decreased when the thickness of the dielectric layer is increased, and therefore, a capacitance change rate is also decreased, and an impedance control width in the variable matching circuit becomes small.

Further, since an electric current easily flows to the variable-capacitance capacitor in a case of high-frequency signals, there is a problem such that the variable-capacitance capacitor generates heat and breaks down because of loss resistance while the variable-capacitance capacitor is used in a high-frequency circuit, and therefore, the electric high power handling capability of the variable matching circuit against the high-frequency signals is low. It is effective also for the problem of the electric high power handling capability to increase the thickness of the dielectric layer and decrease a heat generation amount per unit volume. However, there is a problem such that the direct current electric field strength is also decreased when the thickness of the dielectric layer is increased, and therefore, a capacitance change rate is also decreased, and an impedance control width in the variable matching circuit becomes small.

Furthermore, as shown in an equivalent circuit view of FIG. 19, bias signals are supplied from a bias terminal V via a bias supply circuit G to a variable-capacitance diode 201, so that the independent bias supply circuit G formed by a choke coil L2 is necessary in the variable matching circuit. Therefore, there is a problem such that it is necessary to design the bias supply circuit G separately from the variable matching circuit, it takes time for regulation thereof. Moreover, there is a problem such that the circuit becomes large-sized as a whole because the variable matching circuit and the bias supply circuit G are separately formed. The same problem occurs even if the variable-capacitance diode is replaced with a variable-capacitance capacitor.

Still further, there is a problem such that the variable-capacitance diode 201 has a polarity for an applied voltage, and therefore, it is required to pay attention to the polarity not only when designing but also when mounting, and it takes time for mounting.

Furthermore, a variable resonance circuit made by combining impedance devices including inductor components such as an inductor and a transmission line, and a variable-capacitance diode has been known since before, and has been used as a resonance circuit of a voltage controlled oscillator, a voltage controlled variable filter, and a notch circuit for eliminating unnecessary harmonics components and noise components.

However, the conventional variable resonance circuit using the variable-capacitance diode has a problem such that loss at a high frequency is large in the variable-capacitance diode, and therefore, loss in the entire resonance circuit becomes large, and a resonance characteristic is deteriorated. For example, in the case of using the resonance circuit in the filter, there is a problem such that selectivity, a passing characteristic, an attenuation characteristic and so on are deteriorated by deterioration in a resonance waveform at a resonance frequency. Moreover, in the case of using the resonance circuit in the oscillator, there is a problem such that the C/N and S/N of the oscillator are deteriorated.

Still further, the conventional variable resonance circuit using the variable-capacitance diode has a problem such that the variable resonance circuit can be used only in a receiving apparatus and a receiving circuit that need small operation power, because the electric high power handling capability of the variable-capacitance diode is low and a distortion characteristic due to the nonlinearity of capacitance is large. In other words, there is a problem such that the variable matching circuit cannot be used in a transmission apparatus or a transmission circuit that need large operation power.

Further, in the conventional variable resonance circuit using the variable-capacitance capacitor as proposed in Japanese Unexamined Patent Publication JP-A 10-335903 (1998), a capacitance change of the variable-capacitance capacitor is caused also by a high-frequency voltage, so that the variable resonance circuit has a problem such that distortion characteristics such as waveform distortion and intermodulation distortion become large when the high-frequency voltage is high. Moreover, in order to make the distortion characteristics small, it is necessary to decrease the high-frequency electric field strength of the variable-capacitance capacitor and reduce the capacitance change by the high-frequency voltage. It is effective therefor to increase the thickness of a dielectric layer. However, there is a problem such that direct current electric field strength is also decreased when the thickness of the dielectric layer is increased, and therefore, a capacitance change rate is also decreased, and a resonance frequency variable width in the variable resonance circuit becomes small.

Further, since an electric current easily flows to the variable-capacitance capacitor in a case of high-frequency signals, there is a problem such that the variable-capacitance capacitor generates heat and breaks down because of loss resistance while the variable-capacitance capacitor is used in a high-frequency circuit, and therefore, the electric high power handling capability of the variable resonance circuit is low. It is effective also for the problem of the electric high power handling capability to increase the thickness of the dielectric layer and decrease a heat generation amount per unit volume. However, there is a problem such that the direct current electric field strength is also decreased when the thickness of the dielectric layer is increased, and therefore, a capacitance change rate is also decreased, and a resonance frequency variable width in the variable resonance circuit becomes small.

Furthermore, in the variable resonance circuit using the variable-capacitance diode, as shown in an equivalent circuit view of FIG. 20, bias signals are supplied from bias terminals V1 and V2 via a bias supply circuit G to a variable-capacitance diode 201, so that the independent bias supply circuit G formed by choke coils L2 and L3 is necessary in the variable resonance circuit. Therefore, there is a problem such that it is necessary to design the bias supply circuit G, it takes time for regulation thereof. Moreover, there is a problem such that the circuit becomes large-sized as a whole because the variable resonance circuit and the bias supply circuit G are separately formed. With respect to the need for the bias supply circuit C, the conventional variable resonance circuit has the same problem even if the variable-capacitance diode is replaced with a variable-capacitance capacitor.

Still further, the variable resonance circuit using the variable-capacitance diode also has a problem such that the variable-capacitance diode 201 has a polarity for an applied voltage, and therefore, it is required to pay attention to the polarity not only when designing but also when mounting, and it takes time for mounting.

Furthermore, a variable phase-shifting circuit made by combining a transmission line, a circulator and a variable capacitance diode has been known since before, and has been used as a phase-shifting circuit for beam control of a phased-array antenna, for an amplifier and the like.

Further, a variable phase-shifting circuit made by using a voltage control type of dielectric varactor instead of a variable-capacitance diode, and combining the varactor as a reflective terminal portion with a rat-race coupler or placing the voltage control type of dielectric varactor within a stub in a radius direction extending from a microstrip line has bean proposed (refer to Japanese Unexamined Patent Publication based on International Application JP-A 2002-528899, for example). The voltage control type of dielectric varactor is composed of a substrate having a first dielectric constant and having an almost flat surface, a controllable ferroelectric layer having a second dielectric constant larger than the first dielectric constant and disposed on the almost flat surface of the substrate, and first and second electrodes disposed on a surface of the controllable ferroelectric layer opposite to the almost flat surface of the substrate, the first and second electrodes are separated so as to form a gap therebetween. The voltage control type of dielectric varactor corresponds to a variable-capacitance capacitor.

However, the conventional variable phase-shifting circuit using the variable capacitance diode has a problem such that loss at a high frequency is large in the variable-capacitance diode, and therefore, loss in the entire phase-shifting circuit becomes large is deteriorated.

However, the variable phase-shifting circuit using the variable-capacitance diode has a problem such that the variable phase-shifting circuit can be used only in a receiving apparatus and a receiving circuit that need small operation power, because the electric high power handling capability of the variable-capacitance diode is low and a distortion characteristic due to the nonlinearity of capacitance is large. In other words, there is a problem such that the variable matching circuit cannot be used in a transmission apparatus or a transmission circuit that need large operation power.

Furthermore, in the variable phase-shifting circuit using the variable-capacitance diode, as shown in an equivalent circuit view of FIG. 21, bias signals are supplied from a bias terminal V via a bias supply circuit G to variable-capacitance diodes 201 and 202, so that the independent bias supply circuit G formed by choke coils L1 and L2 is necessary in the variable phase-shifting circuit. Therefore, there is a problem such that it is necessary to design the bias supply circuit G separately from the variable phase-shifting circuit, it takes time for regulation thereof. Moreover, there is a problem such that the circuit becomes large-sized as a whole because the variable phase-shifting circuit and the bias supply circuit G are separately formed. The same problem occurs even if the variable-capacitance diode is replaced with a variable-capacitance capacitor.

Still further, in the variable phase-shifting circuit using the variable-capacitance diode, there is a problem such that the variable-capacitance diode 201 and 202 has a polarity for an applied voltage, and therefore, it is required to pay attention to the polarity not only when designing but also when mounting, and it takes time for mounting.

Further, in the conventional variable phase-shifting circuit using the voltage control type of dielectric varactor as proposed in JP-A 2002-528899, a capacitance change of the voltage control type of dielectric varactor (i.e., the variable-capacitance capacitor) is caused also by a high-frequency voltage, so that the variable phase-shifting circuit has a problem such that distortion characteristics such as waveform distortion and intermodulation distortion become large when the high-frequency voltage is high. Moreover, in order to make the distortion characteristics small, it is necessary to decrease the high-frequency electric field strength of the variable-capacitance capacitor and reduce the capacitance change by the high-frequency voltage. It is effective therefor to increase the gap of a capacitance forming portion. However, there is a problem such that direct current electric field strength is also decreased when the gap of a capacitance forming portion is increased, and therefore, a capacitance change rate is also decreased, and a variable width of the phase-shitting amount in the variable phase-shifting circuit becomes small.

Further, since an electric current easily flows to the variable-capacitance capacitor in a case of high-frequency signals, there is a problem such that the variable-capacitance capacitor generates heat and breaks down because of loss resistance while the variable-capacitance capacitor in used in a high-frequency circuit, and therefore, the electric high power handling capability of the variable phase-shifting circuit is low. It is effective also for the problem of the electric high power handling capability to increase the gap of the capacitance forming portion (i.e., to increase the thickness of the dielectric layer) and decrease a heat generation amount per unit volume. However, there is a problem such that the direct current electric field strength is also decreased when the gap of a capacitance forming portion is increased (i.e., the thickness of the dielectric layer is increased), and therefore, a capacitance change rate is also decreased, and variable width of the phase shifting amount in the variable phase-shifting circuit becomes small.

Furthermore, since before, a variable attenuation circuit that is made by combining a distributor for distributing signals to a plurality of paths, a synthesizer for synthesizing the signals passed through the plurality of paths, and a variable-capacitance diode, that counteracts the signals according to the phase difference of the distributed signals of the respective paths, and that attenuates the signals has been known (refer to Japanese Unexamined Patent Publication JP-A 6-177694 (1994), for example).

However, the conventional variable attenuation circuit using the variable-capacitance diode has a problem such that the electric high power handling capability of the variable-capacitance diode is low and a distortion characteristic due to the nonlinearity of capacitance is large.

Further, in the conventional variable attenuation circuit using the variable-capacitance diode, loss at a high frequency in the variable-capacitance diode is large, and therefore, for example, in a case where the variable attenuation circuit is used in a receiving circuit, the level of a reception signal is small, and there arises a problem such that a signal is attenuated when attenuation of the signal is not desired.

Furthermore, in the variable attenuation circuit using the variable-capacitance diode, as shown in an equivalent circuit view of FIG. 22, bias signals are supplied from a bias terminal V via a bias supply circuit G to a variable-capacitance diode 201, so that the independent bias supply circuit G formed by choke coils L1 and L2 is necessary in the variable attenuation circuit. Therefore, there is a problem such that it is necessary to design the bias supply circuit G, it takes time for regulation thereof. Moreover, there is a problem such that the circuit becomes large-sized as a whole because the variable attenuation circuit and the bias supply circuit G are separately formed.

Still further, in the variable attenuation circuit using the variable-capacitance diode, there is a problem such that the variable capacitance diode 201 has a polarity for an applied voltage, and therefore, it is required to pay attention to the polarity not only when designing but also when mounting, and it takes time for mounting.

In FIG. 22, reference numerals T11, T12, T13, T21, T22 and T23 denote λ/4 transmission lines, reference numerals R101 and R102 denote resistors, reference numerals C101 and C102 denote direct current restriction capacitance devices, reference symbol I denotes an input signal terminal, and reference symbol O denotes an output signal terminal.

SUMMARY OF THE INVENTION

The invention was devised in consideration of the conventional problems as described above, and an object thereof is to provide a variable matching circuit, a variable resonance circuit, a variable phase-shifting circuit and a variable attenuation circuit that has excellent characteristics, for example, that is excellent in electric high power handling capability, low-distortion, low-loss and stable.

Further, another object of the invention is to provide a variable matching circuit, a variable resonance circuit, a variable phase-shifting circuit and a variable attenuation circuit that does not need a bias supply circuit independent from a variable-capacitance device and is easy to operate.

The invention provide a variable matching circuit, comprising:

an impedance device; and a variable-capacitance capacitor, wherein the variable-capacitance capacitor is formed in a manner that a plurality of variable-capacitance devices using thin film dielectric layers whose dielectric constants change depending on applied voltages are connected to each other in parallel regarding a direct current and connected to each other in series regarding a high frequency, between an input terminal and an output terminal.

Further, in the invention, the variable-capacitance capacitor has a bias supply circuit which is connected to electrodes of the plurality of variable-capacitance devices and includes at least one of a resistance component and an inductor component.

Furthermore, in the invention, the plurality of variable-capacitance devices consist of an odd number of variable-capacitance devices, and the variable-capacitance capacitor is formed in a manner that the odd number of variable-capacitance devices are connected to each other in parallel regarding a direct current and connected to each other in series regarding a high frequency.

According to the invention, in a variable matching circuit including an impedance device and a variable-capacitance capacitor, the variable-capacitance capacitor is formed in a manner that a plurality of variable-capacitance devises using thin film dielectric layers whose dielectric constants change depending on applied voltages are connected to each other in parallel regarding a direct current and connected to each other in series regarding a high frequency, between an input terminal and an output terminal. Therefore, the variable-capacitance capacitor is formed in a manner that the plurality of variable-capacitance devices are connected to each other in parallel regarding a direct current, and therefore, it is possible to apply specified bias signals to the respective variable capacitance devices. Consequently, it is possible to make the maximum use of the rates of capacitance changes of the respective variable-capacitance devices by the bias signals and cause match to a desired impedance.

Further, according to the invention, the variable-capacitance capacitor is formed in a manner that the plurality of variable-capacitance devices are connected to each other in series regarding a high frequency. Therefore, a high frequency voltage applied to the variable-capacitance devices is divided and applied to the respective variable-capacitance devices. Therefore, the high-frequency voltages applied to the individual variable-capacitance devices become low because of the division of the voltage. Consequently, it is possible to restrain a capacitance change to high-frequency signals of the variable-capacitance capacitor to be small. Therefore, it is possible to suppress waveform distortion, intermodulation distortion and the like of the variable matching circuit. Furthermore, since the plurality of variable-capacitance devices are connected to each other in series regarding a high frequency, the same effect as in the case of increasing the film thickness of the dielectric layer of the variable-capacitance device can be obtained, and it is possible to reduce a heat generation amount per unit volume by the loss resistance of the variable-capacitance capacitor. As a result, it is possible to increase the electric high power handling capability of the variable matching circuit.

Still further, according to the invention, since the variable-capacitance device using the thin film dielectric layer whose dielectric constant changes depending on a voltage applied to the variable-capacitance capacitor is used, it is possible to make loss in the variable-capacitance capacitor to be low even at a high frequency, so that it is possible to make loss in characteristic of the variable matching circuit to be low.

Still further, according to the invention, when the variable-capacitance capacitor has a bias supply circuit which is connected to electrodes of the plurality of variable-capacitance devices and includes at least one of a resistance component and an inductor component, an independent bias supply circuit installed in an external wiring board as in a conventional variable matching circuit is unnecessary, so that the variable matching circuit is miniaturized, and an operation of the variable matching circuit is facilitated.

Furthermore, according to the invention, the plurality of variable-capacitance devices consist of an odd number of variable-capacitance devices, and the variable-capacitance capacitor is formed in a manner that the odd number of variable-capacitance devices are connected to each other in parallel regarding a direct current and connected to each other in series regarding a high frequency, so that it is possible to make a signal terminal of the variable-capacitance capacitor and a bias terminal to be common and it is possible to operate equally with a general capacitor.

The invention provides a variable resonance circuit, comprising:

an impedance device having an inductor component; and a variable-capacitance capacitor connected to an impedance device in series or in parallel, wherein the variable-capacitance capacitor is formed in a manner that a plurality of variable-capacitance devices using thin film dielectric layers whose dielectric constants change depending on applied voltages are connected to each other in parallel regarding a direct current and connected to each other in series regarding a high frequency, between an input terminal and an output terminal.

Further, in the invention, the variable-capacitance capacitor has a bias supply circuit which is connected to electrodes of the plurality of variable-capacitance devices and includes at least one of a resistance component and an inductor component.

Furthermore, in the invention, the plurality of variable-capacitance devices consist of an odd number of variable-capacitance devices, and the variable-capacitance capacitor is formed in a manner that the odd number of variable capacitance devices are connected to each other in parallel regarding a direct current and connected to each other in series regarding a high frequency.

According to the invention, in a variable resonance circuit such that an impedance device having an inductor component and a variable-capacitance capacitor are connected to each other in series or in parallel, the variable-capacitance capacitor is formed in a manner that a plurality of variable-capacitance devices using thin film dielectric layers whose dielectric constants change depending on applied voltages are connected to each other in parallel regarding a direct current and connected to each other in series regarding a high frequency between an input terminal and an output terminal. Therefore, the variable-capacitance capacitor is formed in a manner that the plurality of variable-capacitance devices are connected to each other in parallel regarding a direct current. Accordingly, it is possible to apply specified bias signals to the respective variable-capacitance devices, and consequently, it is possible to make the maximum use of the rates of capacitance changes of the respective variable-capacitance devices by the bias signals and cause resonance at a desired frequency.

Further, according to the invention, the variable-capacitance capacitor is formed in a manner that the plurality of variable-capacitance devices are connected to each other in series regarding a high frequency, so that a high-frequency voltage applied to the variable-capacitance devices is divided and applied to the respective variable-capacitance devices. Therefore, the high-frequency voltages applied to the individual variable-capacitance devices become low because of the division of the voltage. Consequently, it is possible to restrain a capacitance change to high-frequency signals of the variable-capacitance capacitor to be small. Therefore, it is possible to greatly suppress waveform distortion, intermodulation distortion and the like of the variable resonance circuit. Furthermore, since the plurality of variable-capacitance devices are connected to each other in series regarding a high frequency, the same effect as in the case of increasing the film thickness of the dielectric layer of the variable-capacitance device can be obtained, and it is possible to reduce a heat generation amount per unit volume by the loss resistance of the variable-capacitance capacitor. As a result, it is possible to increase the electric high power handling capability of the variable resonance circuit.

Still further, according to the invention, since the variable-capacitance device using the thin film dielectric layer whose dielectric constant changes depending on a voltage applied to the variable-capacitance capacitor is used, it is possible to make loss in the variable-capacitance capacitor to be low even at a high frequency as compared with a case of using a variable-capacitance diode using barrier capacitance as the variable-capacitance device, so that it is possible to improve resonance characteristics such as selectivity, a passing characteristic and an attenuation characteristic of the variable resonance circuit.

Still further, according to the invention, when the variable-capacitance capacitor has a bias supply circuit which is connected to electrodes of the plurality of variable-capacitance devices and includes at least one of a resistance component and an inductor component, an independent bias supply circuit installed in an external wiring board as in a conventional variable resonance circuit is unnecessary, so that the variable resonance circuit is miniaturized, and an operation of the variable resonance circuit is facilitated.

Further, according to the invention, the plurality of variable-capacitance devices consist of an odd number of variable-capacitance devices, and the variable-capacitance capacitor is formed in a manner that the odd number of variable-capacitance devices are connected to each other in parallel regarding a direct current and connected to each other in series regarding a high frequency, so that it is possible to make a signal terminal of the variable-capacitance capacitor and a bias terminal to be common and it is possible to operate equally with a general capacitor.

The invention provides a variable phase-shifting circuit, comprising:

a transmission line or a circulator; and a variable-capacitance capacitor connected to the grounding side of the transmission line or to a grounding side terminal of the circulator, wherein the variable-capacitance capacitor is formed in a manner that a plurality of variable-capacitance devices using thin film dielectric layers whose dielectric constants change depending on applied voltages are connected to each other in parallel regarding a direct current and connected to each other in series regarding a high frequency between an input terminal and an output terminal.

Further, in the invention, the variable-capacitance capacitor has a bias supply circuit which is connected to electrodes of the plurality of variable-capacitance devices and includes at least one of a resistance component and an inductor component.

Furthermore, in the invention, the plurality of variable-capacitance devices consist of an odd number of variable-capacitance devices, and the variable-capacitance capacitor is formed in a manner that the odd number of variable-capacitance devices are connected to each other in parallel regarding a direct current and connected to each other in series regarding a high frequency.

According to the invention, a variable phase-shifting circuit in which a transmission line or a circulator is provided and a variable-capacitance capacitor is connected to the grounding side of the transmission line or to a grounding side terminal of the circulator, and the variable-capacitance capacitor is formed in a manner that a plurality of variable-capacitance devices using thin film dielectric layers whose dielectric constants change depending on applied voltages are connected to each other in parallel regarding a direct current and connected to each other in series regarding a high frequency, between an input terminal and an output terminal. Therefore, the variable-capacitance capacitor is formed in a manner that the plurality of variable-capacitance devices are connected to each other in parallel regarding a direct current, and therefore, it is possible to apply specified bias signals to the respective variable-capacitance devices. Consequently, it is possible to make the maximum use of the rates of capacitance changes of the respective variable-capacitance devices by the bias signals, shift a phase and obtain the desired phase-shifting amount.

Further, according to the variable resonance circuit of the invention, the variable-capacitance capacitor is formed in a manner that the plurality of variable-capacitance devices are connected to each other in series regarding a high frequency. Therefore, a high-frequency voltage applied to the variable-capacitance devices is divided and applied to the respective variable-capacitance devices, and therefore, the high frequency voltages applied to the individual variable-capacitance devices become low because of the division of the voltage. Consequently, it is possible to restrain a capacitance change to high-frequency signals of the variable-capacitance capacitor to be small. Therefore, it is possible to greatly suppress waveform distortion, intermodulation distortion and the like of the variable phase-shifting circuit. Furthermore, since the plurality of variable-capacitance devices are connected to each other in series regarding a high frequency, the same effect as in the case of increasing the film thickness of the dielectric layer of the variable capacitance device can be obtained, and it is possible to reduce a heat generation amount per unit volume by the loss resistance of the variable capacitance capacitor. As a result, it is possible to increase the electric high power handling capability of the variable phase-shifting circuit.

Still further, according to the invention, since the variable-capacitance device using the thin film dielectric layer whose dielectric constant changes depending on a voltage applied to the variable-capacitance capacitor is used, it is possible to make loss in the variable-capacitance capacitor to be low even at a high frequency as compared with a case of using a variable-capacitance diode using barrier capacitance as the variable-capacitance device, so that it is possible to improve phase-shifting characteristics such as a passing characteristic of the variable phase-shifting circuit.

Still further, according to the invention, when the variable-capacitance capacitor has a bias supply circuit which is connected to electrodes of the plurality of variable-capacitance devices and includes at least one of a resistance component and an inductor component, an independent bias supply circuit installed in an external wiring board as in a conventional variable phase-shifting circuit is unnecessary, so that the variable phase-shifting circuit is miniaturized, and an operation of the variable phase-shifting circuit is facilitated.

Furthermore, according to the invention, the plurality of variable-capacitance devices consist of an odd number of variable-capacitance devices, and the variable-capacitance capacitor is formed in a manner that the odd number of variable-capacitance devices are connected to each other in parallel regarding a direct current and connected to each other in series regarding a high frequency, so that it is possible to make a signal terminal of the variable-capacitance capacitor Ct and a bias terminal to be common and it is possible to operate equally with a general capacitor.

The invention provides a variable attenuation circuit, comprising:

a distributor for distributing signals to a plurality of paths;

a synthesizer for synthesizing the signals passed through the plurality of paths; and a variable-capacitance capacitor inserted into at least one of the paths, wherein the variable-capacitance capacitor is formed in a manner that a plurality of variable capacitance devices using thin film dielectric layers whose dielectric constants change depending on applied voltages are connected to each other in parallel regarding a direct current and connected to each other in series regarding a high frequency, between an input terminal and an output terminal.

Further, in the invention, the variable-capacitance capacitor has a bias supply circuit which is connected to electrodes of the plurality of variable-capacitance devices and includes at least one of a resistance component and an inductor component.

Furthermore, in the invention, the plurality of variable-capacitance devices consist of an odd number of variable-capacitance devices, and the variable-capacitance capacitor is formed in a manner that the odd number of variable-capacitance devices are connected to each other in parallel regarding a direct current and connected to each other in series regarding a high frequency.

According to the invention, a variable attenuation circuit provided with a distributor for distributing signals to a plurality of paths, a synthesizer for synthesizing the signals passed through the plurality of paths, and a variable-capacitance capacitor inserted into at least one of the paths, and the variable-capacitance capacitor is formed in a manner that a plurality of variable-capacitance devices using thin film dielectric layers whose dielectric constants change depending on applied voltages are connected to each other in parallel regarding a direct current and connected to each other in series regarding a high frequency, between an input terminal and an output terminal. Therefore, the variable-capacitance capacitor is formed in a manner that the plurality of variable-capacitance devices are connected to each other in parallel regarding a direct current, and herefore, it is possible to apply specified bias signals to the respective variable-capacitance devices, and consequently, it is possible to make the maximum use of the rates of capacitance changes of the respective variable-capacitance devices by the bias signals, regulate the phase of a signal, and obtain a desired arbitrary attenuation amount by synthesizing the signal and a signal passed through the other path.

Further, according to the invention, the variable-capacitance capacitor is formed in a manner that the plurality of variable-capacitance devices are connected to each other in series regarding a high frequency, so that a high-frequency voltage applied to the variable-capacitance devices is divided and applied to the respective variable-capacitance devices. Therefore, the high-frequency voltages applied to the individual variable-capacitance devices become low because of division of the voltage, and consequently, it is possible to restrain a capacitance change to high-frequency signals of the variable-capacitance capacitor to be small. Therefore, it is possible to greatly suppress waveform distortion, intermodulation distortion and the like of the variable attenuation circuit. Furthermore, since the plurality of variable-capacitance devices are connected to each other in series regarding a high frequency, the same effect as in the case of increasing the film thickness of the dielectric layer of the variable-capacitance device can be obtained, and it is possible to reduce a heat generation amount per unit volume by the loss resistance of the variable-capacitance capacitor. As a result, it is possible to increase the electric high power handling capability of the variable attenuation circuit.

Still further, according to the invention, since the variable-capacitance device using the thin film dielectric layer whose dielectric constant changes depending on a voltage applied to the variable-capacitance capacitor, it is possible to make loss in the variable-capacitance capacitor to be low even at a high frequency as compared with a case of using a variable-capacitance diode using barrier capacitance as the variable-capacitance device, so that it is possible to accurately control the minimum value of the attenuation amount of the variable attenuation circuit to a smaller value.

Still further, according to the invention, when the variable-capacitance capacitor has a bias supply circuit which is connected to electrodes of the plurality of variable-capacitance devices and includes at least one of a resistance component and an inductor component, an independent bias supply circuit installed in an external wiring board as in a conventional variable attenuation circuit is unnecessary, so that the variable attenuation circuit is miniaturized, and an operation of the variable attenuation circuit is facilitated.

Furthermore, according to the invention, the plurality of variable capacitance devices consist of an odd number of variable-capacitance devices, and the variable-capacitance capacitor is formed in a manner that the odd number of variable-capacitance devices are connected to each other in parallel regarding a direct current and connected to each other in series regarding a high frequency, so that it is possible to make a signal terminal of the variable-capacitance capacitor and a bias terminal to be common and it is possible to operate equally with a general capacitor.

As described above, according to the invention, it is possible to provide a variable matching circuit, a variable resonance circuit, a variable phase-shifting circuit and a variable attenuation circuit in which waveform distortion and intermodulation distortion are small and that is excellent in electric high power handling capability, low-loss and stable. Moreover, it is possible to provide a variable matching circuit, a variable resonance circuit, a variable phase-shifting circuit and a variable attenuation circuit that do not need an independent bias supply circuit, and that is small-sized and easy to operate.

BRIEF DESCRIPTION OF THE DRAWINGS

Other and further objects, features, and advantages of the invention will be more explicit from the following detailed description taken with reference to the drawings wherein.

DETAILED DESCRIPTION

Figure 1:
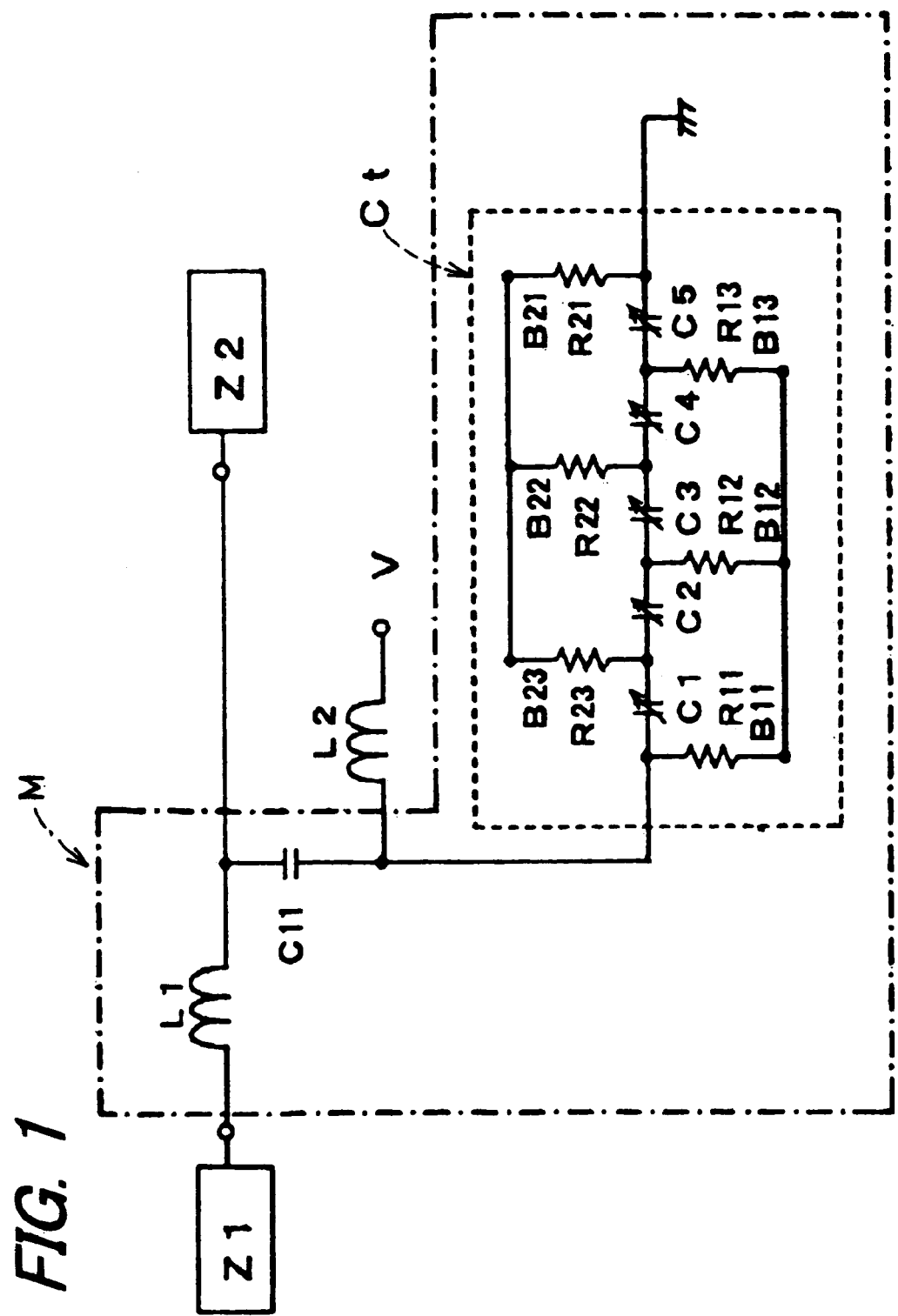
FIG. 1 is an equivalent circuit view showing a variable matching circuit according to a first embodiment of the invention.

Now referring to the drawings, preferred embodiments of the invention are described below.

In the following, a variable matching circuit of the invention will be described in detail with reference to the drawings.

Figure 2:
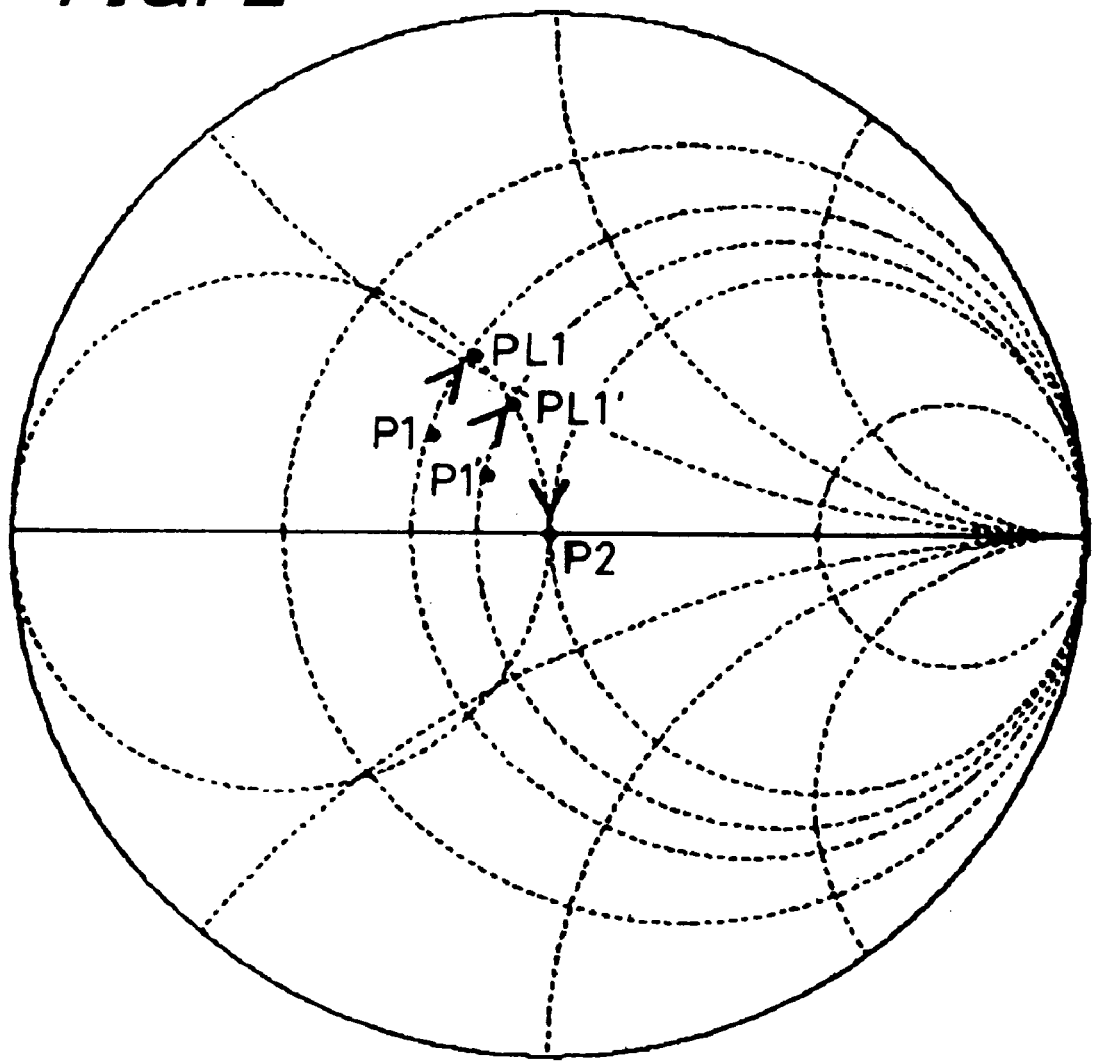
FIG. 2 is a Smith chart for describing impedance matching of the variable matching circuit shown in FIG. 1.
Figure 3:
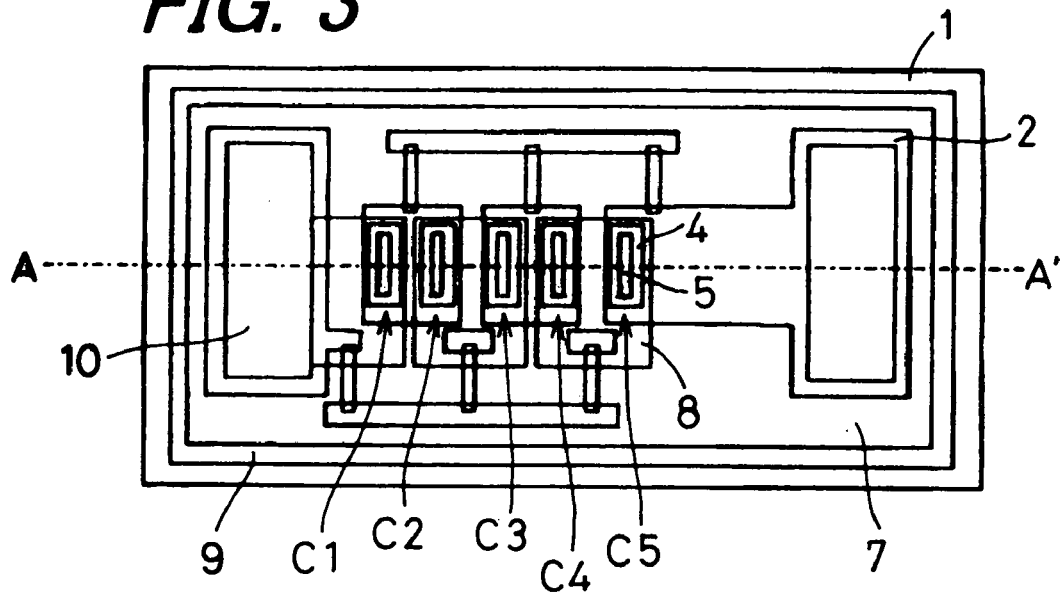
FIG. 3 is a perspective plan view showing an example of a variable-capacitance capacitor having five variable capacitance devices.
Figure 4:
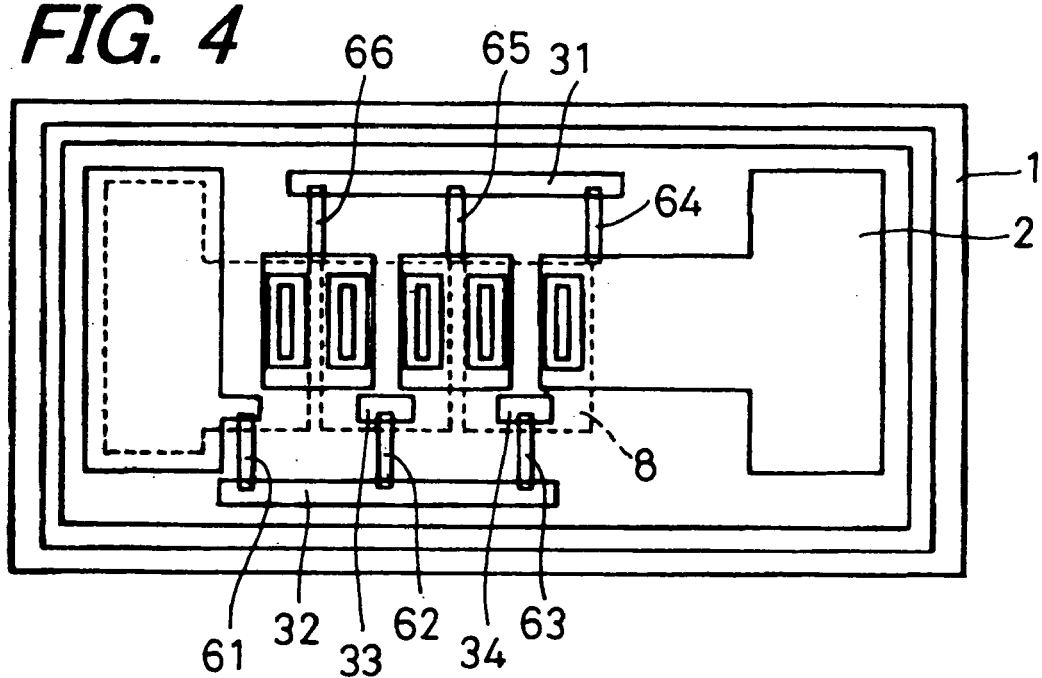
FIG. 4 is a plan view showing a state in the middle of production of the variable-capacitance capacitor shown in FIG. 3.
Figure 5:
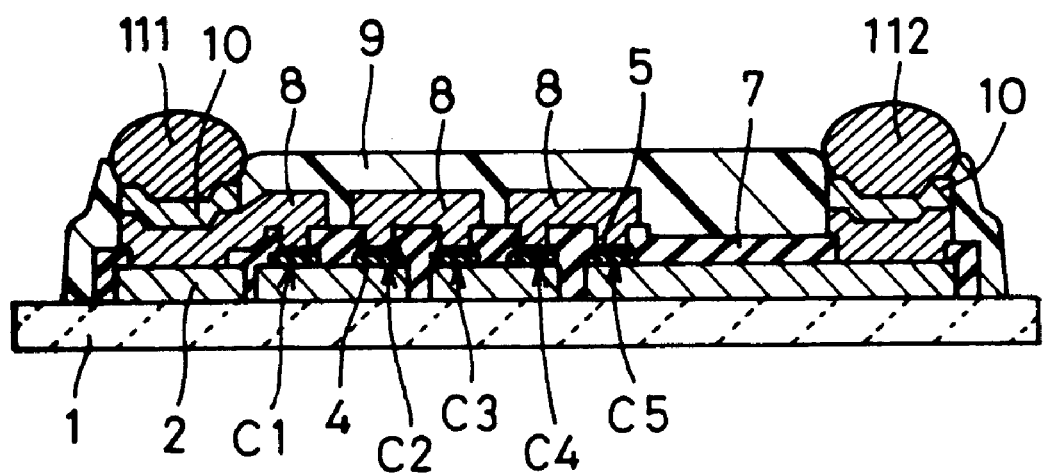
FIG. 5 is a cross section view taken on a line A–A' of FIG. 3.

FIGS. 1 to 5 show a variable matching circuit according to a first embodiment of the invention, respectively. FIG. 1 is an equivalent circuit view of an LC low-pass type of variable matching circuit M using a variable-capacitance capacitor having five variable-capacitance devices, and FIG. 2 is a Smith chart for describing impedance matching of a variable matching circuit M shown in FIG. 1. Moreover, FIGS. 3 to 5 show examples of a variable-capacitance capacitor having five variable-capacitance devices, FIG. 3 is a perspective plan view, FIG. 4 is a plan view showing a state in the middle of production, and FIG. 5 is a cross section view taken on line A–A' of FIG. 3.

In the equivalent circuit view shown in FIG. 1, reference numerals C1, C2, C3, C4 and C5 denote variable-capacitance devices, reference numerals B11, B12 and B13 denote first bias lines including at least one of resistance components and inductor components (resistance components R11, R12 and R13 are shown in the drawing), and reference numerals B21, B22 and B23 denote second bias lines including at least one of resistance components and an inductor components (resistance components R21, R22 and R23 are shown in the drawing).

In a variable-capacitance capacitor Ct formed in the above manner, high-frequency signals flow via the valuable-capacitance devices C1, C2, C3, C4 and C5 connected to each other in series between an input terminal and an output terminal of the variable-capacitance capacitor Ct. At this moment, the resistance components R11, R12 and R13 of the first bias lines B11, B12 and B13 and the resistance components R21, R22 and R23 of the second bias lines B21, B22 and B23 are high impedance components to an impedance in a frequency region of the high-frequency signals of the variable-capacitance devices C1, C2, C3, C4 and C5, and have no adverse effects on the impedance of the high-frequency band.

Further, a bias signal that controls a capacitance component of the variable-capacitance device C1 is supplied from a bias terminal V via an inductance L2, and flows to a ground via the variable-capacitance device C1. The dielectric constant of the variable-capacitance device C1 becomes a specified one according to a voltage applied to the variable-capacitance device C1, with the result that a desired capacitance component can be obtained. Since the variable-capacitance devices C2, C3, C4 and C5 are also connected to each other in parallel regarding a direct current via the first bias lines B11, B12 and B13 and the second bias lines B21, B22 and B23, bias signals of the same magnitude regarding a direct current are applied in the same way, and it is possible to obtain specified capacitance components.

As a result, in the variable-capacitance capacitor, direct current bias signals for controlling the capacitances of the variable-capacitance devices C1, C2, C3, C4 and C5 to desired values can be supplied to the variable-capacitance devices C1, C2, C3, C4 and C5 stably and separately, and dielectric constants in thin film dielectric layers of the variable-capacitance devices C1, C2, C3, C4 and C5 can be changed according to application of bias signals in a desired manner. Thereby, the variable-capacitance capacitor Ct whose capacitance components are easily controlled, is realized. Consequently, it is possible to be set to a desired characteristic impedance by the variable-capacitance capacitor Ct, and it is possible to be matched with a desired impedance by the variable matching circuit of the invention using the variable-capacitance capacitor.

Further, high-frequency signals inputted to the variable-capacitance capacitor Ct, that is, high-frequency signals inputted to the variable-capacitance devices C1, C2, C3, C4 and C5 do not leak via the first bias lines B11, B12, B13 or the second bias lines B21, B22, B23, because the resistance components R11, R12 and R13 and the resistance components R21, R22 and R23 are high impedance components to an impedance in a frequency region of the high-frequency signals. Consequently, bias signals are independently applied to the variable-capacitance devices C1, C2, C3, C4 and C5 in a stable manner, with the result that it is possible to make the maximum use of the rates of capacitance changes of the respective variable-capacitance devices C1, C2, C3, C4 and C5 by bias signals.

That is, in the variable capacitance capacitor Ct, N variable-capacitance devices (N is an integral number of two or more), here, the five variable-capacitance devices C1, C2, C3, C4 and C5 can be considered as variable-capacitance devices connected to each other in series regarding a high frequency.

Accordingly, a high-frequency voltage applied to the variable-capacitance devices C1, C2, C3, C4 and C5 connected to each other in series is divided and applied to the respective variable-capacitance devices C1, C2, C3, C4 and C5, so that the high-frequency voltages applied to the individual variable-capacitance devices C1, C2, C3, C4 and C5 become low. Consequently, it is possible to restrain a capacitance change to a high-frequency signal to be small, and it is possible, as a variable matching circuit, to suppress waveform distortion, intermodulation distortion and the like.

Further, since the variable-capacitance devices C1, C2, C3, C4 and C5 are connected to each other in series, the same effect as in the case of increasing the layer thickness of the dielectric layer of the capacitance device is obtained regarding a high frequency, so that it is possible to reduce a heat generation amount per unit volume by the loss resistance or the variable-capacitance capacitor, and it is possible, as a variable matching circuit, to increase electric high power handling capability.

In the case of using an odd number of variable-capacitance devices as in the variable-capacitance capacitor Ct shown in FIG. 1, it is possible to make a signal terminal of the variable-capacitance capacitor Ct and a bias terminal to be common, so that it is possible to operate equally with a general capacitor.

In the equivalent circuit view shown in FIG. 1, reference numeral L1 denotes an inductor serving as an impedance device, reference symbol Ct denotes a variable-capacitance capacitor, reference numeral L2 denotes a choke coil that includes an RF blocking inductance component for supplying a control voltage (a bias signal), and reference numeral C11 denotes a direct current restrictions capacitance device.

A case of matching in the variable matching circuit M on the assumption that the impedance of an input side circuit Z1 to the variable matching circuit M of the invention is P1 and the impedance of an output side circuit Z2 is P2 in the equivalent circuit view of FIG. 1 will be described by the use of a Smith chart of FIG. 2.

On the Smith chart, which is normalized by the impedance P2 of the output side circuit Z2, the impedance P1 point existing inside an equal conductance line passing through the P2 can be matched by the serial inductance L1 and the parallel capacitance Ct as shown in FIG. 1.

Describing more, the impedance P1 point of the input side circuit Z1 is moved clockwise on an equi-resistance circle by the serial inductance component L1, and reaches a PL1 point. The PL1 point is a point on the equiconductance passing through the P2 point. The PL1 point is moved clockwise on the equiconductance by an initial value Ct1 of the parallel variable-capacitance capacitor, and reaches the P2 point, whereby matching is achieved.

Further, also when the impedance of the input side circuit Z1 is P1', an impedance P1' point of the input side circuit Z1 is moved clockwise on an equi-resistance circle by the serial inductance component L1, and reaches a PL1' point. The PL1' point is a point on the equiconductance passing through the P2 point. The PL1' point is moved clockwise on the equiconductance by Ct2 obtained by regulating the capacitance value of the parallel variable-capacitance capacitor Ct by an applied voltage, and reaches the P2 point, whereby matching is achieved.

That is, regarding different impedances like P1 and P1' of the input side circuit Z1, it is possible to achieve impedance matching with the output side circuit Z2, only by regulating the capacitance value of the variable-capacitance capacitor Ct by an applied voltage.

Although one example is shown here, it is possible to use the variable matching circuit M by changing the structure thereof according to objects within the scope of the invention, for example, to an LC high-pass type, a π type, a T type, and a multistage structure.

Next, an example of a method for producing the variable-capacitance capacitor Ct composing the variable matching circuit of the invention will be described.

FIG. 3 is a perspective plan view showing an example of a variable-capacitance capacitor having five variable-capacitance devices regarding a variable-capacitance capacitor in a variable matching circuit of the invention, FIG. 4 is a plan view showing a state in the middle of production of the variable-capacitance capacitor shown in FIG. 3, and FIG. 5 is a cross section view taken on line A–A' of the variable-capacitance capacitor shown in FIG. 3.

In FIGS. 3 to 5, reference numeral 1 denotes a supporting substrate, reference numeral 2 denotes a lower electrode layer, reference numerals 31, 32, 33 and 34 denote conductor lines, reference numeral 4 denotes a thin film dielectric layer, reference numeral 5 denotes an upper electrode layer, reference numerals 61, 62, 63, 64, 65 and 66 denote thin film resistors, reference numeral 7 denotes an insulating layer, reference numeral 8 denotes a bridge electrode layer, reference numeral 9 denotes a protecting layer, and reference numeral 10 denotes a solder-diffusion preventing layer. The solder diffusion preventing layer 10 and a solder terminal portion 111 compose a first signal terminal (an input terminal), and the solder-diffusion preventing layer 10 and a solder terminal portion 112 compose a second signal terminal (an output terminal).

The supporting substrate 1 is a ceramic substrate made of alumina ceramics, a single crystal substrate made of sapphire, and the like. The lower electrode layer 2, the thin film dielectric layer 4 and the upper electrode layer 5 are successively formed on the almost whole surface of the supporting substrate 1. After the respective layers are formed, the upper electrode layer 5, the thin film dielectric layer 4 and the lower electrode layer 2 are successively etched into specified shapes.

Because sputtering at high temperatures is required for formation of the thin film dielectric layer 4, the lower electrode layer 2 needs to have a high melting point so as to bear the high temperatures. In concrete, the lower electrode layer 2 is made of a metallic material such as Pt or Pd. The lower electrode layer 2 is also formed by high-temperature sputtering. Moreover, after formed by high-temperature sputtering, the lower electrode layer 2 is heated to a temperature of 700° C. to 900° C., which is a temperature for sputtering the thin film dielectric layer 4, and is retained for a specified time at this temperature until sputtering of the thin film dielectric layer 4 is started, thereby becoming a flat layer.

It is desirable that the lower electrode layer 2 is thick when considering the continuity of the lower electrode layer 2 with resistance components from the second signal terminal to the fifth variable-capacitance device C5, resistance components from the first variable-capacitance device C1 to the second variable-capacitance device C2, and resistance components from the third variable-capacitance device C3 to the fourth variable-capacitance device C4, but it is desirable that the lower electrode layer 2 is relatively thin when considering the adhesion with the supporting substrate 1, and therefore, the thickness of the lower electrode layer 2 is determined in consideration of both the continuity and the adhesion. In concrete, the thickness is 0.1 µm to 10 µm. When the thickness of the lower electrode layer 2 becomes less than 0.1 µm, the resistance of the lower electrode layer 2 own becomes high, and moreover, there is a possibility that the continuity of the lower electrode layer 2 cannot be secured. On the contrary, when the thickness becomes more than 10 µm, internal stress becomes high, and there is a possibility such that the adhesion with the supporting substrate 1 is decreased and the supporting substrate 1 is warped.

It is preferable that the thin film dielectric layer 4 is a dielectric layer that is made of perovskite type oxide crystal containing at least Ba, Sr or Ti and has a high dielectric constant. The thin film dielectric layer 4 is formed on the surface (the upper surface) of the lower electrode layer 2. For example, by targeting on a dielectric material such that perovskite type oxide crystal can be obtained, film formation by a sputtering method is executed until desired thickness is obtained. At this moment, by executing high-temperature sputtering at a high board-temperature of, for example, 800° C., it is possible, without executing heat treatment after sputtering, to obtain a low-loss thin film dielectric layer 4 having a high dielectric constant and a high capacitance change rate.

Although it is desirable to use Au, which has low resistivity, as a material of the upper electrode layer 5 so as to lower the resistance of the upper electrode layer, it is desirable to use Pt or the like as an adhesion layer in order to increase the adhesion with the thin film dielectrode layer 4. The thickness of the upper electrode layer 5 is in the range of 0.1 µm to 10 µm. The lower limit of the thickness is set in consideration of the resistance of the upper electrode layer 5 own, in the same manner as in the lower electrode layer 2. Moreover, the upper limit of the thickness is set in consideration of the adhesion with the thin film dielectric layer 4.

The first bias lines B11, B12 and B13 composing a bias supply circuit are composed of the conductor lines 32, 33 and 34 and the thin film resistor 61, 62 and 63, respectively. The thin film resistor 61 is disposed between the conductor line 32 and a connection point between the first bias terminal (common with the first signal terminal) and the first variable-capacitance device C1. The thin film resistor 62 is disposed between the conductor line 32 and a connection point between the second variable-capacitance device C2 and the third variable-capacitance device C3, that is, the conductor line 33 connected to the bridge electrode layer 8 connecting the upper electrode layer 5 of the second variable-capacitance device C2 and the upper electrode layer 5 of the third variable-capacitance device C3. The thin film resistor 63 is disposed between the conductor line 32 and a connection point between the fourth variable-capacitance device C4 and the fifth variable-capacitance device C5, that is, the conductor line 34 connected to the bridge electrode layer 8 connecting the upper electrode layer 5 of the fourth variable-capacitance device C4 and the upper electrode layer 5 of the fifth variable-capacitance device C5.

In a similar manner, the second bias lines B21, B22 and B23 are composed of the conductor line 31 and the thin film resistors 64, 65 and 66, respectively. The thin film resistor 64 is disposed between the conductor line 31 and a connection point between the second bias terminal (common with the second signal terminal) and the fifth variable-capacitance device C5. The thin film resistor 65 is disposed between the conductor line 31 and a connection point between the third variable-capacitance device C3 and the fourth variable capacitance device C4. The thin film resistor 66 is disposed between the conductor line 31 and a connection point between the first variable-capacitance device C1 and the second variable-capacitance device C2.

The conductor lines 31, 32, 33 and 34 can be formed by executing film formation newly after forming the lower electrode layer 2, the thin film dielectric layer 4 and the upper electrode layer 5 described above. On this occasion, in order to protect the lower electrode layer 2, the thin film dielectric layer 4 and the upper electrode layer 5 which have been formed already, it is desirable to use a lift-off method. Moreover, the conductor lines 31 to 34 can be formed also by executing patterning to simultaneously form the conductor lines 31 to 34 at the time of patterning of the lower electrode layer 2.

Although it is desirable to use Au, which is low-resistance, as a material of the conductor lines 31 to 34 in order to suppress variations of the resistance values of the first and second bias lines B11, B12, B13, B21, B22 and B23, it is possible to form by the same material and in the same process as the lower electrode layer 2 by using Pt or the like, because the resistances of the thin film resistors 61, 62, 63, 64, 65 and 66 are sufficiently high.

Next, as materials of the thin film resistors 61 to 66 forming the first and second bias lines B11, B12, B13, B21, B22 and B23, a material containing tantalum (Ta) and having specific resistance of 1 mΩ·cm or more is desirable. In concrete, tantalum nitride (TaN), TaSiN and Ta—Si—O can be exemplified as the material. For example, in the case of tantalum nitride, it is possible to form the thin film resistors 61 to 66 having desired composition ratios and resistivity by a reactive sputtering method of sputtering by targeting on Ta and adding nitrogen.

By properly selecting a condition of sputtering, it is possible to form the thin film resistors 61 to 66 each having film thickness of 40 nm or more and specific resistance of 1 mΩ·cm or more. Moreover, after sputtering, by applying a resist and processing to a specified shape and then executing a process of etching such as reactive ion etching (RIE), it is possible to easily execute patterning.

A case where the variable-capacitance capacitor Ct is used at a frequency of 1 GHz and each of the variable-capacitance devices C1 to C5 has capacitance of 5 pF, is assumed. When the resistance values of the thin film resistors 61 to 66 are set to ten times or more the value of the impedances at 100 MHz of the variable-capacitance devices C1 to C5 so as to have no adverse effects an the impedances from one tenth of the frequency (100 MHz), a necessary resistance value of the first and second bias lines B11, B12, B13, B21, B22 and B23 is approximately 3.2 kΩ or more. In the case of obtaining 10 kΩ as the resistance values of the first and second bias lines B11, B12, B13, B21, B22 and B23 on the assumption that the specific resistance ratios of the thin film resistors 61 to 66 in the variable-capacitance capacitor are 1 mΩ·cm or more, it is possible to make the aspect ratios (length/width) of the thin film resistors 61 to 66 to be 50 or less when the film thickness is 50 nm. Therefore, it is possible to realize the thin film resistors 61 to 66 having realizable aspect ratios without increasing the size of the device.

The first and second bias lines B11, B12, B13, B21, B22 and B23 including the thin film resistors 61 to 66 are formed directly on the supporting substrate 1. Consequently, an insulating layer that is necessary at the time of forming on the variable-capacitance devices C1 to C5 to secure insulation from the lower electrode layer 2, the upper electrode layer 4 and the bridge electrode layer 8 becomes unnecessary, and it is possible to decrease the number of layers forming the variable-capacitance devices C1 to C5. Furthermore, by using the thin film resistors 61 to 66 of high resistance, it is possible to produce the variable-capacitance capacitor without increasing the size of the device.

Next, the insulating layer 7 is necessary for securing insulation between the bridge electrode layer 8 formed thereon and the lower electrode layer 2. Moreover, the insulating layer 7 covers the first and second bias lines B11, B12, B13, B21, B22 and B23, and can prevent the thin film resistors 61 to 66 from being oxidized. Therefore, it is possible to make the resistance values is of the first and second bias lines B11, B12, B13, B21, B22 and B23 to be uniform diachronically, whereby it is possible to increase reliability. The insulating layer 7 is preferably formed of at least one of silicon nitride and silicon oxide in order to increase moisture resistance. It is desirable to form the insulating layer by a chemical vapor deposition (CVD) method or the like in consideration of a covering property.

Further, the insulating layer 7 can be processed to a desired shape by a dry etching method or the like using a general resist. Then, through holes that reach the conductor lines 33 and 34 are disposed in the insulating layer 7 in order to secure connection between the thin film resistors 61 to 66 and the bridge electrode layer 8. It is preferable from the viewpoint of increasing moisture resistance that other regions exposed from the insulating layer 7 are only the upper electrode layer 4 and the solder terminal portions 111 and 112.

Next, the bridge electrode layer 8 connects the upper electrode layer 5 of the first variable-capacitance device C1 and one terminal forming portion 111, and couples the upper electrode layers 5 of the second and third variable-capacitance device C2 and C3 to each other, and couples the upper electrode layers 5 and the fourth and fifth variable-capacitance device C4 and C5 to each other, to connect in series the second variable-capacitance device C2 and the third variable-capacitance device C3, and the fourth variable-capacitance device C4 and the fifth variable-capacitance device C5, respectively. Furthermore, the bridge electrode layer 8 extended over the variable-capacitance devices C2 and C3 and the bridge electrode layer 8 extended over the variable-capacitance devices C4 and C5 are pierced into the through holes of the insulating layer 7 and connected to the conductor lines 33 and 34, respectively. It is desirable to use low-resistance metal such as Au and Cu as a material of the bridge electrode layer 8. Besides, in consideration of the adhesion of the bridge electrode layer 8 with the insulating layer 7, an adhesion layer of Ti, Ni or the like may be used.

Next, the protecting layer 9 is formed so as to cover the whole in a state where the solder terminal portions 111 and 112 are exposed. The protecting layer 9 is for mechanically protecting components including the variable-capacitance devices C1 of the variable-capacitance capacitor Ct, and moreover, protecting the components from being contaminated with chemicals or the like. However, the protecting layer 9 is formed in a manner that the solder terminal portions 111 and 112 are exposed. As a material of the protecting layer 9, a material having high heat resistance and an excellent covering property against steps is good, and specifically, polyimide resin, BCB (benzocyclobutene) resin and the like are used. The protecting layer is formed by applying a resin material and thereafter curing at a specified temperature.

The solder-diffusion preventing layer 10 is formed for preventing that solder of the solder terminal portions 111 and 112 are diffused to the lower electrode layer 2 at the time of reflow and mounting when the solder terminal portions 111 and 112 are formed. Ni is proper as a material of the solder-diffusion preventing layer 10. Moreover, in order to increase solder wettability, there is a case of forming Au, Cu around 0.1 μm or the like, which has high solder wettability, on the surface of the solder-diffusion preventing layer 10.

Finally, the solder terminal portions 111 and 112 are formed. The solder terminal portions are formed to facilitate mounting of the variable-capacitance capacitor to an external wiring board. The solder terminal portions 111 and 112 are generally formed by printing solder paste by the use of a specified mask for the solder terminal portions 111 and 112 and thereafter executing reflow.

According to the variable-capacitance capacitor Ct described above, by using the thin film resistors 61 to 66 containing tantalum nitride and having specific resistance of 1 mΩ·cm or more, for the first and second bias line B11, B12, B13, B21, B22 and B23 or part thereof, the aspect ratios of the thin film resistors 61 to 66 are reduced, and thereby miniaturization of the variable-capacitance capacitor Ct is realized. Further, by forming the first and second bias lines B11, B12, B13, B21, B22 and B23 directly on the supporting substrate 1, the number of layers forming the respective devices including the variable-capacitance device C1 is reduced. Besides, since processes for forming the respective layers, the dielectric layers and the like composing the respective devices can be standardized, it is possible to very easily form though the structure is relatively complicated.

Figure 6:
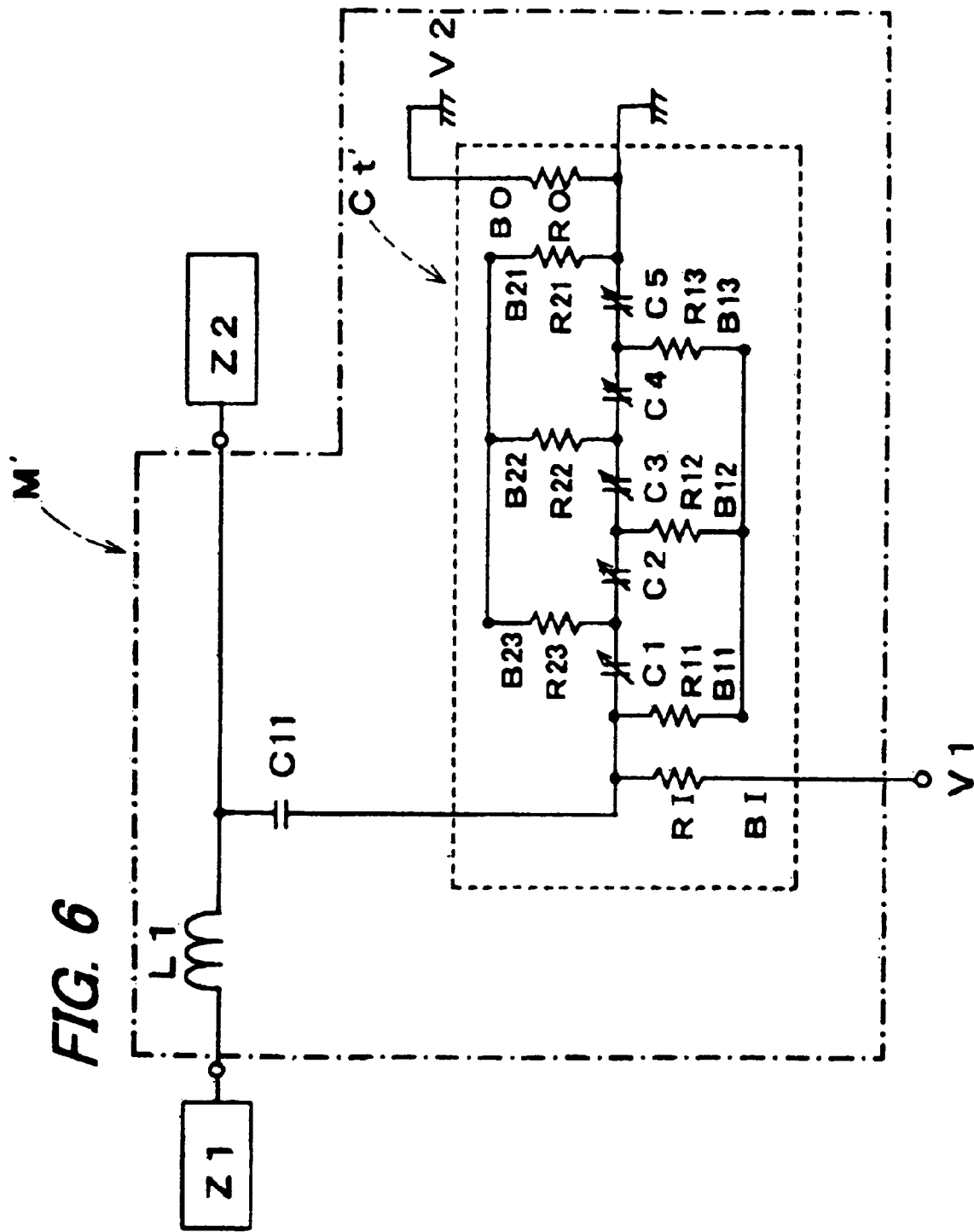
FIG. 6 is an equivalent circuit view showing a variable matching circuit according to a second embodiment of the invention.
Figure 7:
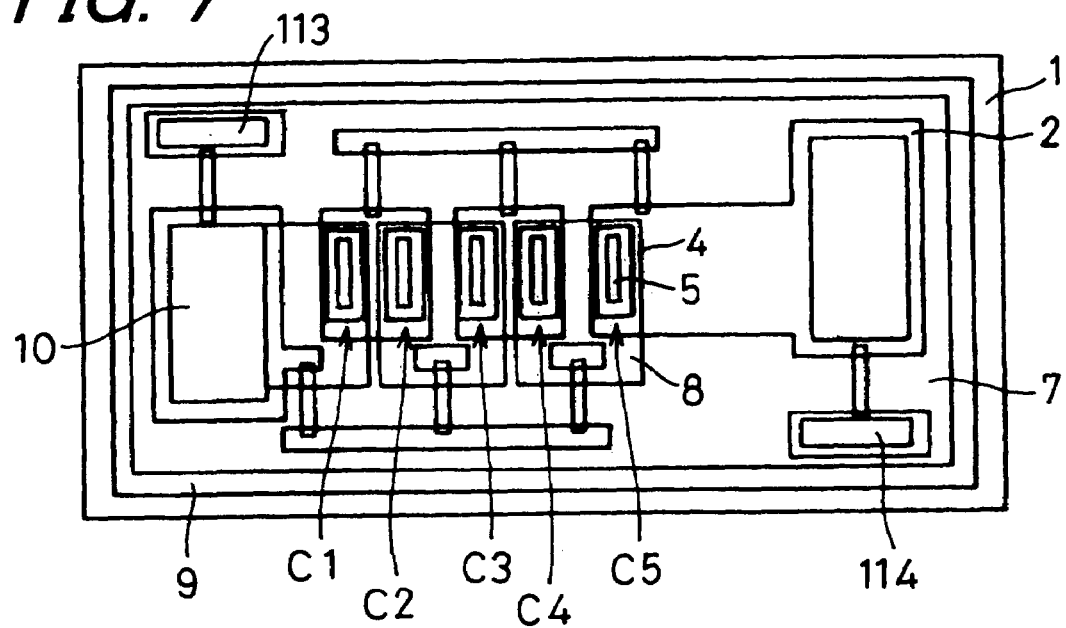
FIG. 7 is a perspective plan view showing an example of a variable-capacitance capacitor having a bias supply circuit.
Figure 8:
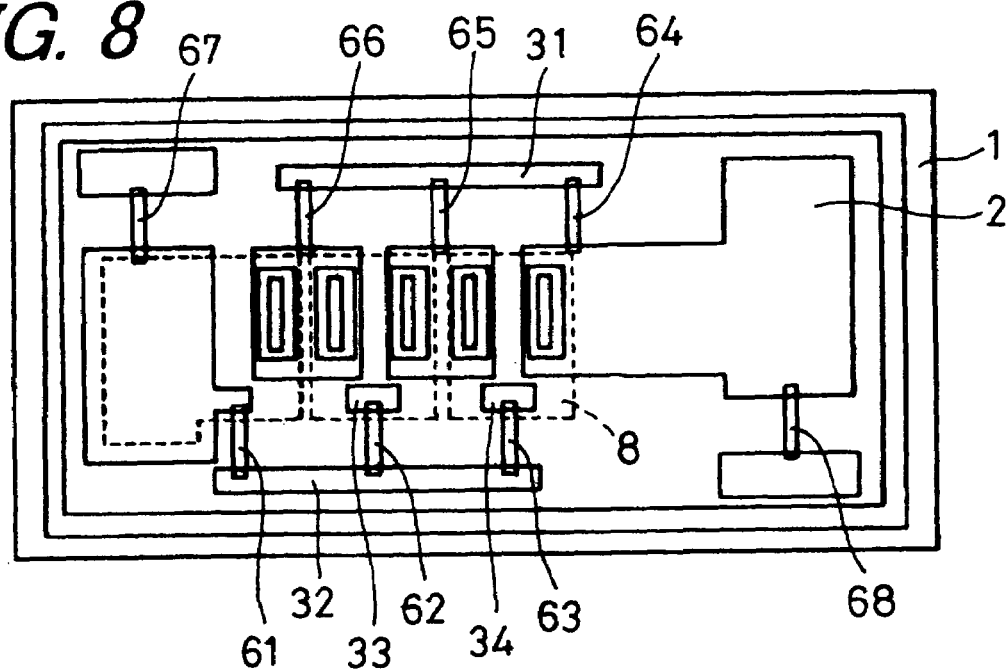
FIG. 8 is a plan view showing a state in the middle of production of the variable-capacitance capacitor shown in FIG. 7.

Next, FIGS. 6 to 8 show a variable matching circuit according to a second embodiment of the invention, and FIG. 6 is an equivalent circuit M' view of an LC low-pass type of variable matching circuit that uses a variable-capacitance capacitor having a bias supply circuit and having five variable-capacitance devices. Moreover, FIG. 7 is a perspective plan view showing an example of the variable-capacitance capacitor having a bias supply circuit, and FIG. 8 is a plan view showing a state in the middle of production thereof. In FIGS. 6 to 8, the same portions as in FIGS. 3 to 5 are denoted by the same reference numerals, and a repeated description thereof will be omitted.

In the equivalent circuit view shown in FIG. 6, reference numerals C1, C2, C3, C4 and C5 denote variable-capacitance devices, reference numerals B11, B12 and B13 denote first bias lines including at least one of resistance components and inductor components (resistance components B11, B12 and B13 are shown in the drawing), and reference numerals B21, B22 and B23 denote second bias lines including at least one of resistance components and inductor components (resistance components R21, R22 and R23 are shown in the drawing), and reference symbols BI and BO denote first and second common bias lines serving as bias supply circuits including at least one of resistance components and inductor components, respectively (resistance components RI and RO are shown in the drawing). Moreover, reference numeral V1 denotes a first bias terminal, that is, a terminal on a side to which a bias signal is supplied, and reference numeral V2 denotes a second bias terminal, that is, a terminal that bias signals applied to the variable-capacitance devices C1, C2, C3, C4 and C5 fall on the grounding side.

In a variable-capacitance capacitor Ct' having such a structure, between an input terminal and an output terminal of the variable-capacitance capacitor, high-frequency signals flow via the variable-capacitance devices C1 to C5 connected to each other in series. At this moment, the resistance components R11, R12, and R13 of the first bias lines B11, B12 and B13 and the resistance components R21, R22 and R23 of the second bias lines B21, B22 and B23 are high impedance components to an impedance in a frequency region of the high-frequency signals of the variable-capacitance devices C1 to C5, and have no adverse effects on the impedance of the high-frequency band.

Further, the resistance component RI of the first common bias line BI and the resistance component RO of the second common bias line BO are high impedance components to an impedance in a frequency region of high-frequency signals of synthetic capacitance of the variable-capacitance devices C1 to C5, and have no adverse effects on the impedance of the high-frequency band.

Still further, a bias signal that controls a capacitance component of the variable-capacitance capacitor Ct' is supplied from the first bias terminal V1, and flows to the second bias terminal V2 (a ground in FIG. 6) via the variable-capacitance device C1. The dielectric constant of the variable-capacitance device C1 becomes a specified one according to a voltage applied to the variable-capacitance device C1, with the result that a desired capacitance component can be obtained. The same applies to the variable-capacitance devices C2 to C5.

As a result, in the variable-capacitance capacitor Ct', bias signals for controlling the capacitance of the variable-capacitance devices C1 to C5 to desired values can be supplied to the variable-capacitance devices C1 to C5 stably and separately, and the dielectric constants in the thin film dielectric layers of the variable-capacitance devices C1 to C5 can be changed by application of bias signals in a desired manner. Therefore, the variable-capacitance capacitor Ct' whose capacitance components are easily controlled, is realized. Consequently, it is possible to be set to an impedance of a desired characteristic by the variable-capacitance capacitor Ct' in a desired manner, and it is possible to be matched with a desired impedance by the variable matching circuit M' of the invention using the variable-capacitance capacitor.

That is, high-frequency signals of the variable-capacitance devices C1 to C5 do not leak via the first bias lines B11, B12, B13, the second bias lines B21, B22, B23 or the resistance component RI of the first common bias line BI did the resistance component RO of the second common bias line BO. Consequently, bias signals are applied to the variable-capacitance devices C1 to C5 stably and independently, with the result that it is possible to make the maximum use of the rates of capacitance changes of the respective variable-capacitance devices C1 to C5 by bias signals.

Further, in the variable capacitance capacitor Ct', N variable-capacitance devices (N is an integral number of 2 or more), here, the five variable-capacitance devices C1 to C5 can be considered as variable-capacitance devices connected to each other in series regarding a high frequency.

Therefore, a high-frequency voltage applied to the variable-capacitance devices connected to each other in series is divided and applied to the respective variable-capacitance devices C1 to C5, so that the high-frequency voltages applied to the individual variable-capacitance devices C1 to C5 become low. Thus, it is possible to restrain capacitance changes to high frequency signals in the individual variable-capacitance devices C1 to C5 to be small, and it is possible, as the variable matching circuit M' using the variable-capacitance capacitor Ct having the variable-capacitance devices C1 to C5, to suppress waveform distortion, intermodulation distortion and the like.

Further, since the variable-capacitance devices C1 to C5 are connected to each other in series, the same effect as in the case of increasing the thickness of the dielectric layer can be obtained regarding a high frequency, it is possible to reduce a heat generation amount per unit volume by the loss resistance of the variable-capacitance capacitor Ct', and it is possible to increase the electric high power handling capability of the variable matching circuit M'.

Still further, since the variable-capacitance capacitor Ct' has the bias supply circuit, an external bias supply circuit used conventionally is not necessary, so that a variable matching circuit M' that is small-sized and very easy to operate is realized.

Still further, in a case where one end of the variable-capacitor capacitor Ct' is connected to the GND (ground) as shown in FIG. 6, there is no need to always dispose the second common bias line BO.

Next, a method for producing the variable-capacitance capacitor Ct' in this embodiment will be described.

In FIGS. 7 and 8, reference numeral 1 denotes a supporting substrate, reference numeral 2 denotes a lower electrode layer, reference numerals 31, 32, 33 and 34 denote conductor lines, reference numeral 4 denotes a thin film dielectric layer, reference numeral 5 denotes an upper electrode layer, reference numerals 61, 62, 63, 64, 65 and 66 denote thin film resistors, reference numeral 7 denotes an insulating layer, reference numeral 8 denotes a bridge electrode layer, reference numeral 9 denotes a protecting layer, reference numeral 10 denotes a solder-diffusion preventing layer, and reference numerals 111, 112, 113 and 114 denote solder terminal portions. The solder-diffusion preventing layer 10 and the solder terminal portion 111 compose a first signal terminal (an input terminal), and the solder-diffusion preventing layer 10 and the solder terminal portion 112 compose a second signal terminal (an output terminal). Moreover, a first bias terminal V1 and a second bias terminal V2 are produced simultaneously when the lower electrode layer 2 is formed. The first bias terminal V1 is composed of the solder-diffusion preventing layer 10 and the solder terminal portion 113, and the second bias terminal V2 is composed of the solder-diffusion preventing layer 10 and the solder terminal portion 114.

A first common bias line BI is disposed between the first bias terminal V1 and a first signal terminal, and a second common bias supply line BO is disposed between the second bias terminal V2 and a second signal terminal. The first common bias line BI and the second common bias line BO in this embodiment are formed by a thin film resistor 67 and a thin film resistor 68, respectively.

For the thin film resistors 67 and 68 forming the first and second common bias lines BI and BO, a material containing tantalum (Ta) and having specific resistance of 1 mΩcm or more is desirable. In concrete, materials such as tantalum nitride, TaSiN and Ta—Si—O can be exemplified. For example, in the case of tantalum nitride, it is possible to form the thin film resistors 67 and 68 having desired composition ratios and specific resistance, by a reactive sputtering method of sputtering by targeting on Ta and adding nitride.

By properly selecting a condition of sputtering, it is possible to form the thin film resistors 67 and 68 having film thickness of 40 nm or more and specific resistance of 1 mΩ·cm or more. Moreover, by, after sputtering, applying a resist and processing to a specified shape and thereafter executing a process of etching such as reactive ion etching (RIE), it is possible to easily execute patterning.

In a case where the variable-capacitance capacitor Ct' is used at a frequency of 1 GHz and capacitance is set to 1 pF, on the assumption that the resistance values of the thin film resistors 67 and 68 are set to values 100 times or more an impedance in this frequency so as to have no adverse effects on the impedance, necessary resistance values of the first and second common bias lines BI and BO are approximately 16 kΩ or more. Since it is desirable that the specific resistance ratios of the thin film resistors 61 to 66 in the variable-capacitance capacitor Ct' are 1 mΩ·cm or more, for example, in the case of obtaining 20 kΩ as the resistance values of the first and second common bias lines BI and BO, it is possible to make the aspect ratios (length/width) of the thin film resistors 67 and 68 to be 100 or less when film thickness is 50 nm, so that it is possible to realize the thin film resistors 67 and 68 having realizable aspect ratios without increasing the size of the device.

Further, the insulating layer 7 is necessary for securing insulation between the bridge electrode layer 8 formed thereon and the lower electrode layer 2. Moreover, the insulating layer 7 covers the first and second common bias lines BI and BO and the first and second bias lines B11, B12, B13, B21, B22 and B23, and can prevent the thin film resistors 61 to 68 from having oxidized, so that it is possible to make the resistance values of the first and second common bias lines BI and BO and the first and second bias lines B11, B12, B13, B21, B22 and B23 to be uniform diachronically, and consequently, it is possible to increase reliability. The insulating layer 7 is preferably formed of at least one of silicon nitride and silicon oxide in order to increase moisture resistance. It is desirable to form the insulating layer by a chemical vapor deposition method or the like in consideration of a covering property.

Further, the insulating layer 7 can be processed to a desired shape by a dry etching method or the like using a general resist. Then, through holes that reach the conductor lines 33 and 34 are disposed in the insulating layer 7 above the conductor lines 33 and 34 so as to expose parts of rho conductor lines 33 and 34 in order to secure connection between the thin film resistors 61 to 66 and the bridge electrode layer 8. It is preferable from the viewpoint of increasing moisture resistance that other regions exposed from the insulating layer 7 are only the upper electrode layer 4 and the solder terminal portions 111, 112, 113 and 114.

Further, the protecting layer 9 is formed so as to cover the whole in a state where the solder terminal portions 111, 112, 113 and 114 are exposed. The protecting layer 9 is for mechanically protecting components including the variable-capacitance device C1 of the variable-capacitance capacitor Ct', and moreover, protecting the components from being contaminated with chemicals or the like. However, the protecting layer 9 is formed in a manner that the solder terminal portions 111, 112, 113 and lid are exposed. As a material of the protecting layer 9, one having high heat resistance and an excellent covering property against steps is good, and in concrete, polyimide resin, BCB resin and the like are used. The protecting layer is formed by applying a resin material and thereafter curing at a specified temperature.

The solder-diffusion preventing layer 10 is formed fur preventing solder of the solder terminal portions 111, 112, 113 and 114 from diffusing to the lower electrode layer 2 at the time of reflow and mounting when the solder terminal portions 111, 112, 113 and 114 are formed. Ni is proper as a material of the solder-diffusion preventing layer 10. Moreover, in order to increase solder wettability, there is a case of forming Au, Cu around 0.1 μm or the like, which has high solder wettability, on the surface of the solder diffusion preventing layer 10.

Finally, the solder terminal portions 111, 112, 113 and 114 are formed. The solder terminal portions are formed to facilitate mounting of the variable-capacitance capacitor Ct to an external wiring board. The solder terminal portions 111, 112, 113 and 114 are generally formed by printing solder paste by the use of a specified mask for the solder terminal portions 111, 112, 113 and 114 and thereafter executing reflow.

According to the variable-capacitance capacitor Ct' described above, by using the thin film resistors 61 to 68 containing tantalum nitride and having specific resistance of 1 mΩ·cm or more, for the first and second common bias lines BI and BO and the first and second bias lines B11, B12, B13, B21, B22 and B23 or a part thereof, the aspect ratios of the thin film resistors 61 to 68 are reduced, and thereby miniaturization of the variable-capacitance capacitor is realized. Further, by forming the first and second common bias lines BI and BO and the first and second bias lines B11, B12, B13, B21, B22 and B23 directly on the supporting substrate 1, the number of layers forming the respective devices including the variable-capacitance device C1 is reduced. Besides, since processes for forming the respective layers, the dielectric layers and the like composing the respective devices can be standardized, it is possible to very easily form though the structure is relatively complicated.

Figure 9:
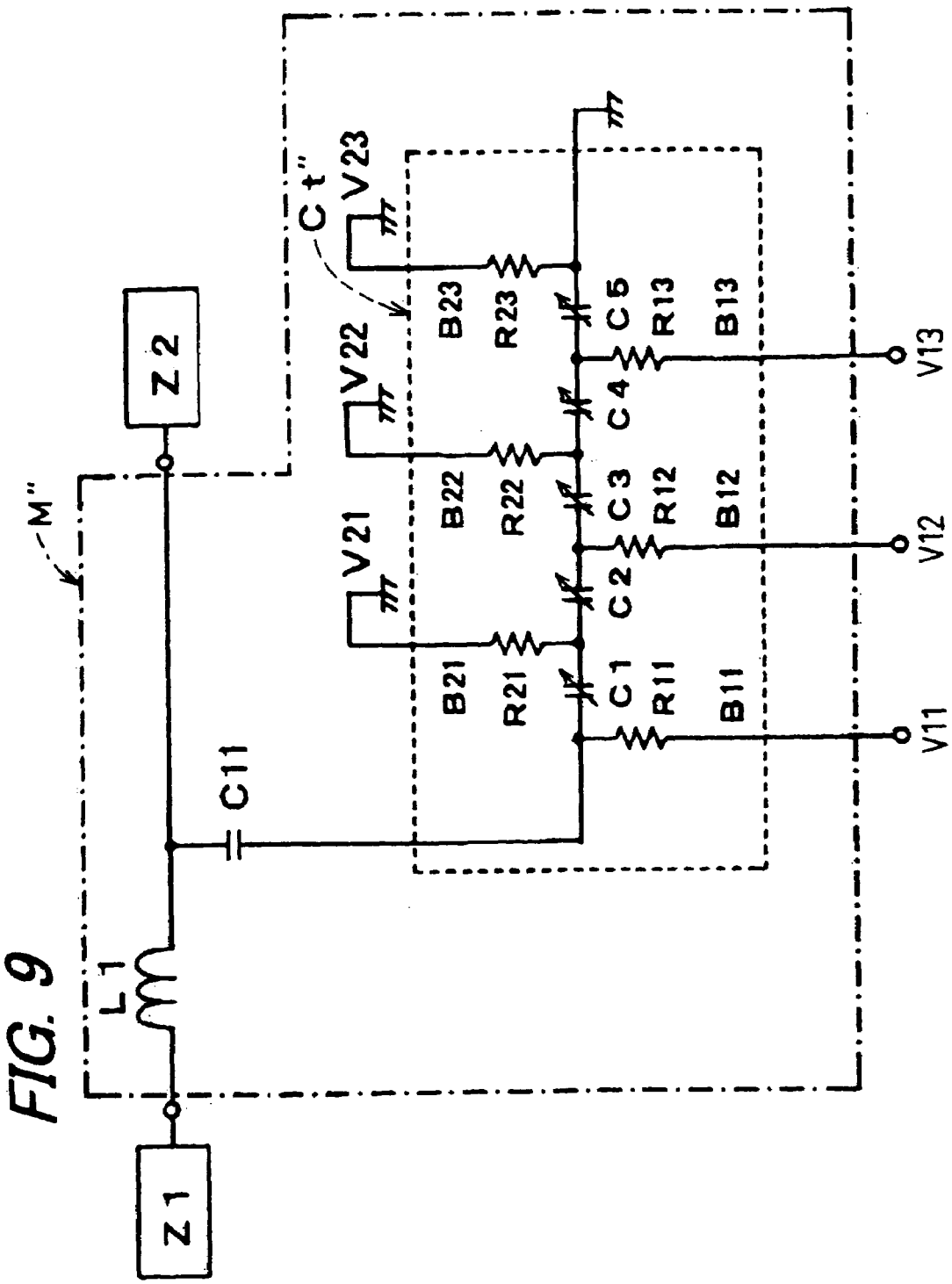
FIG. 9 is an equivalent circuit view showing a variable matching circuit according to a third embodiment of the invention with bias supply circuits disposed individually.

The invention is not restricted to the embodiments described above, and there is nothing against adding various changes within the scope of the invention. For example, although the first and second common bias lines BI and BO serving as bias supply circuits are common in the aforementioned embodimnt, a variable matching circuit M" according to a third embodiment of the invention may have a variable-capacitance capacitor Ct" formed in a manner that the bias lines B11, B12, B13, B21, B22 and B23 serving as bias supply circuits are individually disposed to the variable-capacitance devices C1, C2, C3, C4 and C5 as shown in an equivalent circuit view of FIG. 9.

In the following, a variable resonance circuit of the invention will be described in detail with reference to the drawings.

Figure 10:
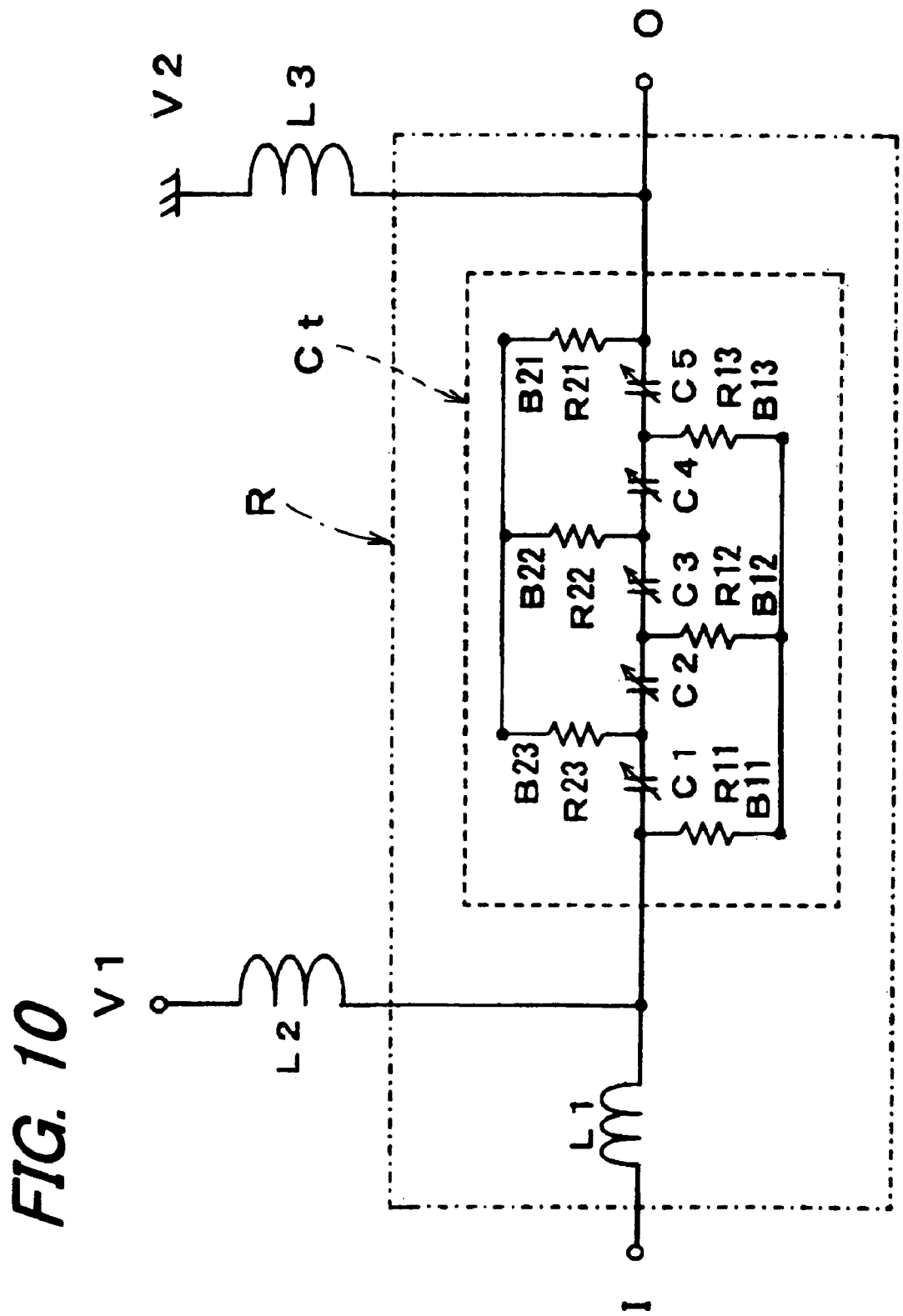
FIG. 10 is an equivalent circuit view showing a variable resonance circuit according to a fourth embodiment of the invention.

FIG. 10 shows a variable resonance circuit according to a fourth embodiment of the invention. FIG. 10 is an equivalent circuit view of an LC series variable resonance circuit R using a variable-capacitance capacitor having five variable-capacitance devices.

In the equivalent circuit view shown in FIG. 10, reference numerals C1, C2, C3, C4 and C5 denote variable-capacitance devices, reference numerals B11, B12 and B13 denote first bias lines including at least one of resistance components and inductor components (resistance components R11, R12 and R13 are shown in the drawing), and reference numerals B21, B22 and B23 denote second bias lines including at least one of resistance components and an inductor components (resistance components R21, R22 and R23 are shown in the drawing).

In a variable-capacitance capacitor Ct formed in the above manner, high frequency signals flow via the variable-capacitance devices C1, C2, C3, C4 and C5 connected to each other in series between an input terminal and an output terminal of the variable-capacitance capacitor Ct. At this moment, the resistance components R11, R12 and R13 of the first bias lines B11, B12 and B13 and the resistance components R21, R22 and R23 of the second bias lines B21, B22 and B23 are high impedance components to an impedance in a frequency region of the high-frequency signals of the variable-capacitance devices C1, C2, C3, C4 and C5, and have no adverse effects on the impedance of the high-frequency band.

Further, a bias signal that controls a capacitance component of the variable-capacitance device C1 is supplied from a bias terminal V1 via an inductance L2, and flows to a bias terminal V2 (a ground in the drawing) via the variable-capacitance device C1. The dielectric constant of the variable capacitance device C1 becomes a specified one according to a voltage applied to the variable-capacitance device C1, with the result that a desired capacitance component can be obtained. Since the variable-capacitance devices C2, C3, C4 and C5 are also connected to each other in parallel regarding a direct current via the first bias lines B11, B12 and B13 and the second bias lines B21, B22 an B23, bias signals of the same magnitude regarding a direct current are applied in the same way, and it is possible to obtain specified capacitance components.

As a result, in the variable-capacitance capacitor Ct, direct current bias signals for controlling the capacitances of the variable-capacitance devices C1, C2, C3, C4 and C5 to desired values can be supplied to the variable-capacitance devices C1, C2, C3, C4 and C5 stably and separately, and dielectric constants in thin film dielectric layers of the variable-capacitance devices C1, C2, C3, C4 and C5 can be changed according in application of bias signals in a desired manner. Therefore, the variable-capacitance capacitor Ct whose capacitance components are easily controlled, is realized. Consequently, it is possible to be set to a resonance frequency of desired characteristic by the variable-capacitance capacitor Ct, and it is possible to be resonated with a desired frequency by the variable resonance circuit R of the invention using the variable-capacitance capacitor Ct.

Further, high frequency signals inputted to the variable-capacitance devices C1, C2, C3, C4 and C5 do not leek via the first bias lines B11, B12, B13 or the second bias lines B21, B22, B23, because the resistance component is R11, R12 and R13 and the resistance components R21, R22 and R23 are high impedance components to an impedance in a frequency region of the high-frequency signals. Consequently, bias signals are independently applied to the variable-capacitance devices C1, C2, C3, C4 and C5 in a stable manner, with the result that it is possible to make the maximum use of the rates of capacitance changes of the respective variable-capacitance devices C1, C2, C3, C4 and C5 by bias signals.

That is, in the variable-capacitance capacitor Ct, N variable-capacitance devices (N is an integral number of two or more), here, the five variable-capacitance devices C1, C2, C3, C4 and C5 can be considered as variable-capacitance devices connected to each other in series regarding a high frequency.

Accordingly, a high-frequency voltage applied to the variable-capacitance devices C1, C2, C3, C4 and C5 connected to each other in series is divided and applied to the respective variable-capacitance devices C1, C2, C3, C4 and C5, so that the high-frequency voltages applied to the individual variable-capacitance devices C1, C2, C3, C4 and C5 become low. Consequently, it is possible to restrain a capacitance change to high-frequency signal to be small, and it is possible, as a variable resonance circuit, to suppress waveform distortion, intermodulation distortion and the like.

Further, since the variable-capacitance devices C1, C2, C3, C4 and C5 are connected to each other in series, the same effect as in the case of increasing the layer thickness of the dielectric layer of the capacitance device is obtained regarding a high frequency, so that it is possible to reduce a heat generation amount per unit volume by the loss resistance of the variable-capacitance capacitor, and it is possible, as a variable resonance circuit, to increase electric high power handling capability.

In the case of using an odd number of variable-capacitance devices as in the variable-capacitance capacitor Ct shown in FIG. 10, it is possible to make a signal terminal of the variable-capacitance capacitor Ct and a bias terminal to be common, so that it is possible to operate equally with a general capacitor.

In an equivalent circuit view shown in FIG. 10, reference numeral L1 denotes an inductor having as an impedance device having an inductor component, reference symbol Ct denotes a variable-capacitance capacitor, and reference numerals L2 and L3 donote choke coils including RF blocking inductance components for supplying control voltages (bias signals). In the case of grounding a signal terminal O to a ground, the choke coil L3 is unnecessary. Moreover, a direct current restriction capacitance device is omitted.

In the equivalent circuit view of FIG. 10, on the assumption that the initial value of the variable-capacitance capacitor Ct is Ct1 and the value of the inductor L1 is L1, a resonance frequency f1 equals $1/(2\pi(L1 \cdot Ct1)^{1/2})$. Moreover, when the capacitance value of the variable capacitance capacitor Ct is regulated to Ct2 by an applied voltage, a resonance frequency f2 equals $1/(2\pi(L1 \cdot Ct2)^{1/2})$. That is, only by regulating the capacitance value of the variable-capacitance capacitor Ct by an applied voltage, it is possible to vary the resonance frequency of the variable resonance circuit R.

Although one example of the variable resonance circuit R of the invention is shown here, it is possible to use the variable resonance circuit R by changing the structure thereof according to objects within the scope of the invention, for example, to an LC parallel structure, and a multi-stage structure. Moreover, it it also possible to use a transmission line, a λ/4 resonator and the like as an impedance device having an inductor component.

An example of a method for producing the variable-capacitance capacitor Ct composing the variable resonance circuit R of the invention is same as the variable-capacitance capacitor Ct of the first embodiment, and the description will be omitted.

Figure 11:
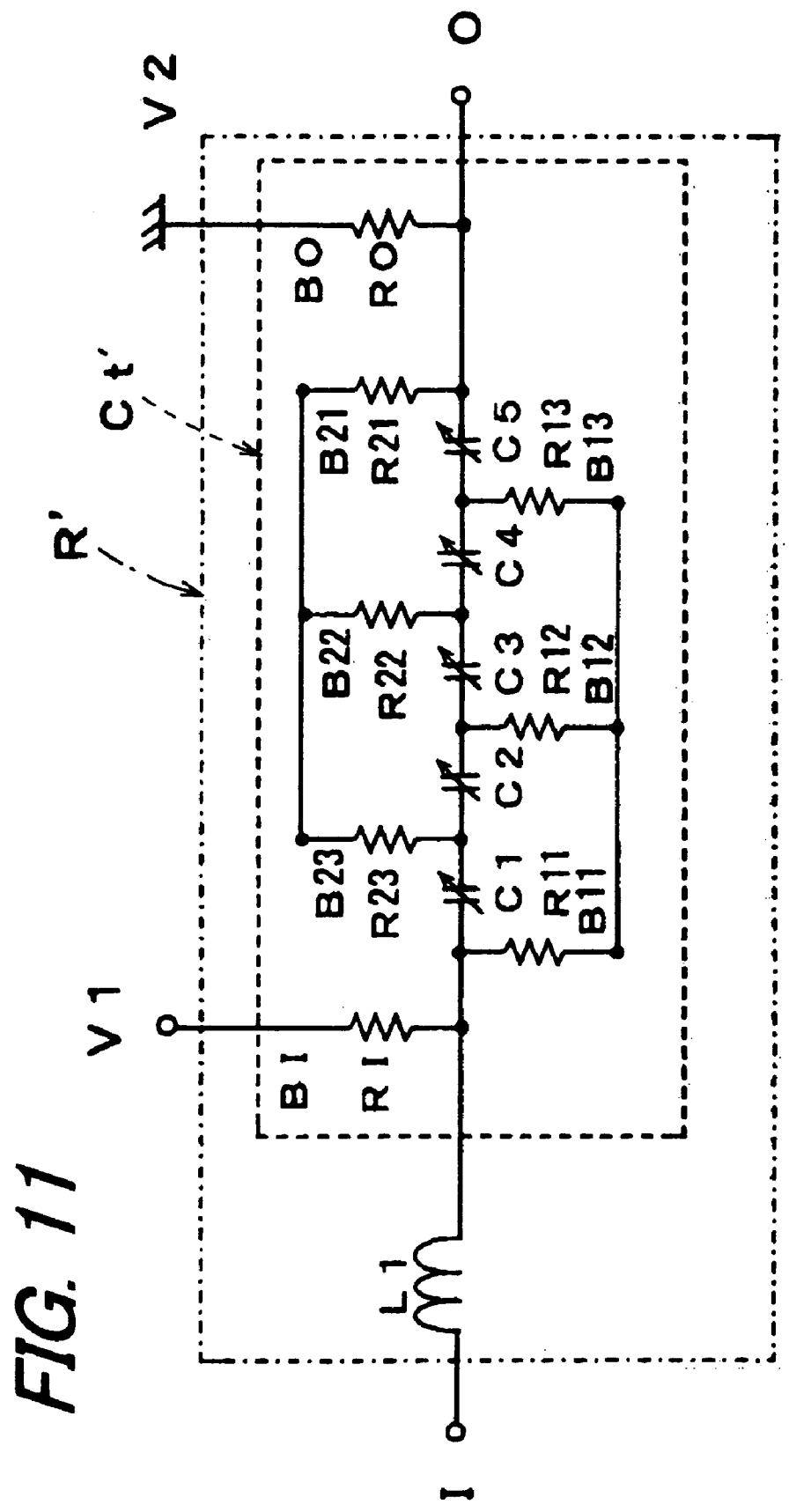
FIG. 11 is an equivalent circuit view showing a variable resonance circuit according to a fifth embodiment of the invention.

Next, FIG. 11 shows a variable resonance circuit according to a fifth embodiment of the invention. FIG. 11 is an equivalent circuit view of an LC series variable resonance circuit R' that uses a variable-capacitance capacitor having a bias supply circuit and having five variable-capacitance devices.

In the equivalent circuit view shown in FIG. 11, reference numerals C1, C2, C3, C4 and C5 denote variable-capacitance devices, reference numerals B11, B12 and B13 denote first bias lines including at least one of resistance components and inductor components (resistance components R11, R12 and R13 are shown in the drawing), and reference numerals B21, B22 and B23 denote second bias lines including at least one of resistance components and inductor components (resistance components R21, R22 and R23 are shown in the drawing), and reference symbols BI and BO denote first and second common bias lines serving as bias supply circuits including at least one of resistance components and inductor components, respectively (resistance components RI and RO are shown in the drawing). Moreover, reference numeral V1 denotes a first bias terminal, that is, a terminal on a side to which a bias signal is supplied, and reference numeral V2 denotes a second bias terminal, that is, a terminal that bias signals applied to the variable-capacitance devices C1, C2, C3, C4 and C5 fall on the grounding side.

In a variable-capacitance capacitor Ct' having such a structure, between an input terminal and an output terminal of the variable-capacitance capacitor Ct', high-frequency signals flow via the variable-capacitance devices C1 to C5 connected to each other in series. At this moment, the resistance components R11, R12 and R13 of the first bias lines B11, B12 and B13 and the resistance components R21, R22 and R23 of the second bias lines B21, B22 and B23 are high impedance components to an impedance in a frequency region of the high-frequency signals of the variable-capacitance devices C1 to C5, and have no adverse effects on the impedance of the high-frequency band.

Further, the resistance component RI of the first common bias line BI and the resistance component RO of the second common bias line BO are high impedance components to an impedance in a frequency region of high-frequency signals of synthetic capacitance of the variable-capacitance devices C1 to C5, and have no adverse effects on the impedance of the high-frequency band.

Still further, a bias signal that controls a capacitance component of the variable-capacitance capacitor Ct' is supplied from the first bias terminal V1, and flows to the second bias terminal V2 (a ground in FIG. 11) via the variable-capacitance device C1. The dielectric constant of the variable capacitance device C1 becomes a specified one according to a voltage applied to the variable-capacitance device C1, with the result that a desired capacitance component can be obtained. The same applies to the variable-capacitance devices C2 to C5.

As a result, in the variable-capacitance capacitor Ct', bias signals for controlling the capacitance of the variable-capacitance devices C1 to C5 to desired values can be supplied to the variable-capacitance devices C1 to C5 stably and separately, and the dielectric constants in the thin film dielectric layers of the variable-capacitance devices C1 to C5 can be changed by application of bias signals in a desired manner. Therefore, the variable-capacitance capacitor Ct' whose capacitance components are easily controlled, is realized. Consequently, it is possible to set to a resonance frequency of a desired characteristic by the variable-capacitance capacitor Ct', and it is possible to be resonated with a desired frequency by the variable resonance circuit R' of the invention using the variable-capacitance capacitor Ct'.

That is, high-frequency signals of the variable-capacitance devices C1 to C5 do not leak via the first bias lines B11, B12, B13, the second bias lines B21, B22, B23 or the resistance component RI of the first common bias line BI and the resistance component RO of the second common bias line BO. Consequently, bias signals are applied to the variable-capacitance devices C1 to C5 stably and independently, with the result that it is possible to make the maximum use of the rates of capacitance changes of the respective variable-capacitance devices C1 to C5 by bias signals.

Further, in the variable-capacitance capacitor Ct', N variable-capacitance devices (N is an integral number of 2 or more), here, the five variable-capacitance devices C1 to C5 can be considered as variable-capacitance devices connected to each other in series regarding a high frequency.

Therefore, a high-frequency voltage applied to the variable-capacitance devices C1 to C5 connected to each other in series is divided and applied to the respective variable-capacitance devices C1 to C5, so that the high-frequency voltage applied to the individual variable capacitance devices C1 to C5 become low. Thus, it is possible to restrain capacitance changes to high-frequency signals in the individual variable-capacitance devices C1 to C5 to be small, and it is possible, as the variable resonance circuit R' using the variable-capacitance capacitor Ct' having the variable-capacitance devices C1 to C5, to suppress waveform distortion, intermodulation distortion and the like.

Further, since the variable-capacitance devices C1 to C5 are connected to each other in series, the same effect as in the case of increasing the thickness of the dielectric layer can be obtained regarding a high frequency, it is possible to reduce a heat generation amount per unit volume by the loss resistance of the variable-capacitance capacitor Ct', and it is possible to increase the electric high power handling capability of the variable resonance circuit R'.

Still further, since the variable-capacitance capacitor Ct' has the bias supply circuit, an external bias supply circuit used conventionally is not necessary, so that a variable resonance circuit R' that is small-sized and very easy to operate is realized.

In the case of grounding the signal terminal O to the ground, there is no need to always dispose a second common bias line BO. Moreover, the direct current restrictions capacitance device is omitted.

A method for producing the variable-capacitance capacitor Ct' in this embodiment io same as the variable-capacitance capacitor Ct' of the second embodiment, and the description will be emitted.

Figure 12:
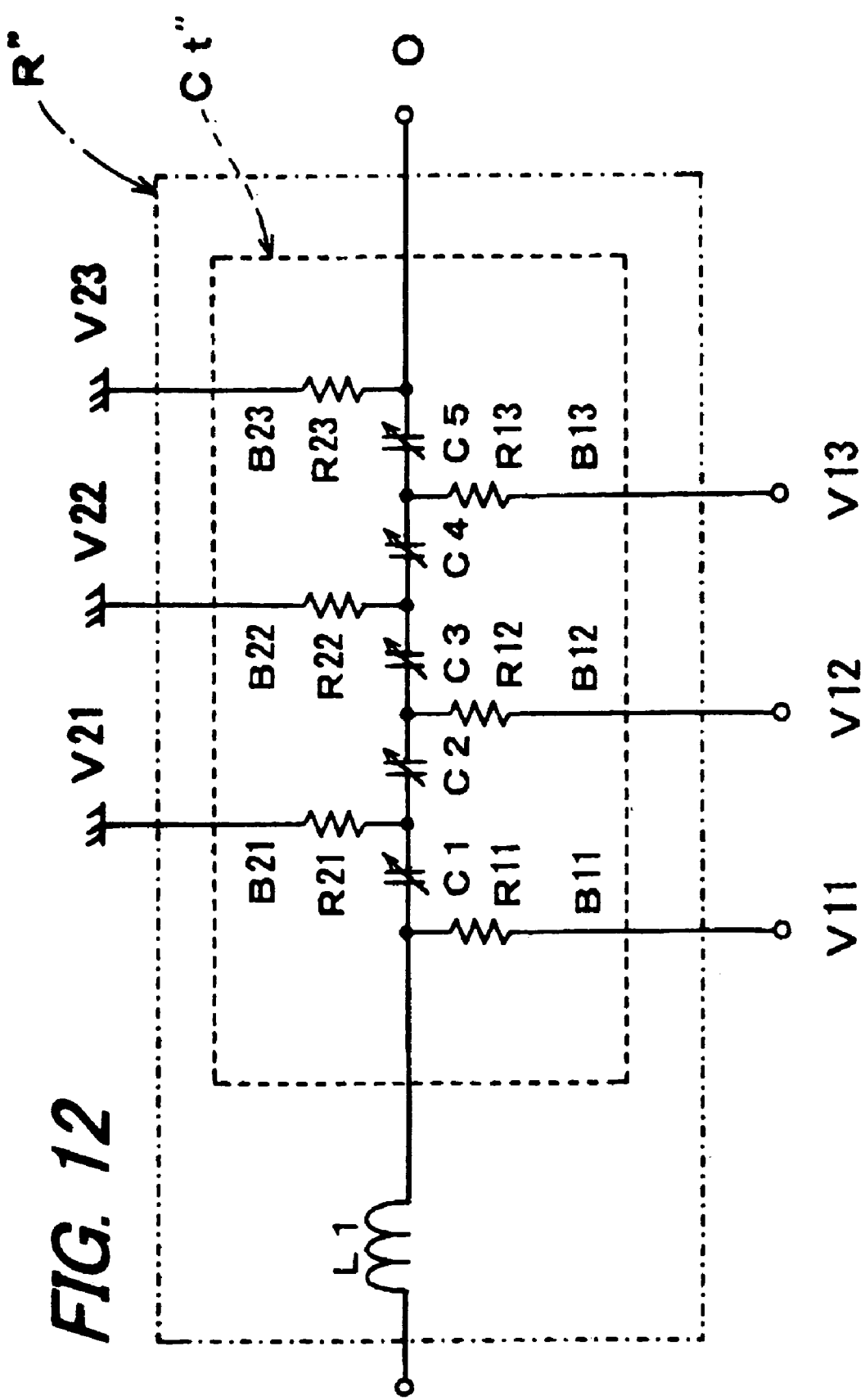
FIG. 12 is an equivalent circuit view showing a variable resonance circuit according to a sixth embodiment of the invention with bias supply circuits disposed individually.

The invention is not restricted to the embodiments described above, and there is nothing against adding various changes within the scope of the invention. For example, although the first and second common bias lines BI and BO serving as bias supply circuits are common in the aforementioned embodiment, a variable resonance circuit R" according to a sixth embodiment of the invention may have a variable-capacitance capacitor Ct" formed in a manner that the bias lines B11, B12, B13, B21, B22 and B23 serving as bias supply circuits are individually disposed to the variable-capacitance devices C1, C2, C3, C4 and C5 as shown in an equivalent circuit of FIG. 12.

In the following, a variable phase-shifting circuit of the invention will be described in detail with reference to the drawings.

Figure 13:
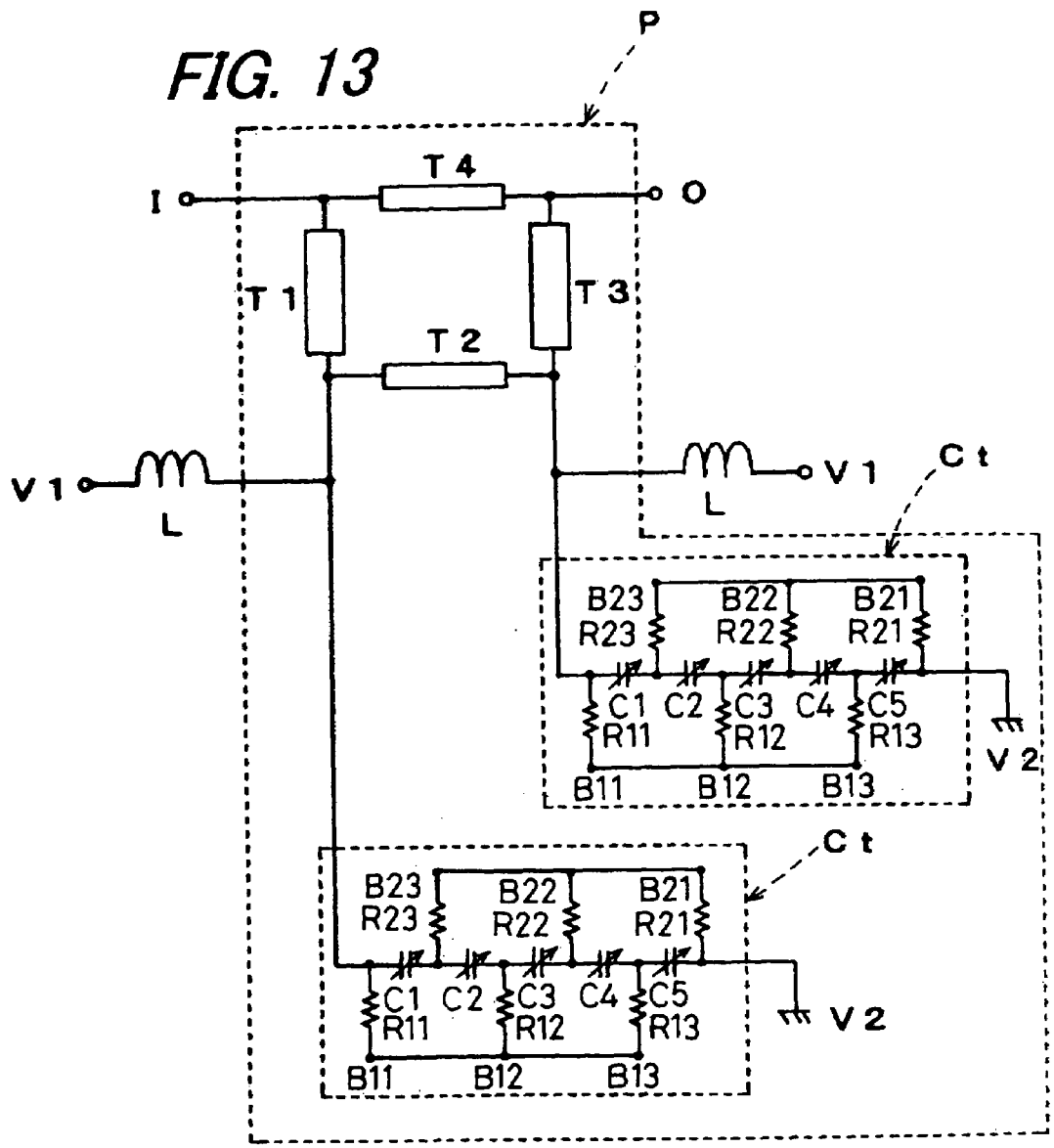
FIG. 13 is an equivalent circuit view showing a variable phase-shifting circuit according to a seventh embodiment of the invention.

FIG. 13 shows a variable phase-shifting circuit according to a seventh embodiment of the invention. FIG. 13 is an equivalent circuit view of a 90-degree hybrid variable phase-shifting circuit P rising a variable-capacitance capacitor having five variable-capacitance devices.

In this equivalent circuit view shown in FIG. 13, reference numeral C1, C2, C3, C4 and C5 denote variable-capacitance devices, reference numerals B11, B12 and B13 denote first bias lines including at least one of resistance components and inductor components (resistance components including R11, R12 and R13 are shown in the drawing), and reference numerals B21, B22 and B23 denote second bias lines including at least one of resistance components and an inductor components (resistance components including R21, R22 and R23 are shown in the drawing).

In a variable-capacitance capacitor Ct formed in the above manner, high-frequency signals flow via the variable-capacitance devices C1, C2, C3, C4 and C5 connected to each other in series between an input terminal and an output terminal of the variable-capacitance capacitor Ct. At this moment, the resistance components R11, R12 and R13 of the first bias lines B11, B12 and B13 and the resistance components R21, R22 and R23 of the second bias lines B21, B22 and B23 are high impedance components to an impedance in a frequency region of the high-frequency signals of the variable-capacitance devices C1, C2, C3, C4 and C5, and have no adverse effects on the impedance of the high-frequency band.

Further, a bias signal that controls a capacitance component of the variable-capacitance device C1 is supplied from a bias terminal V1 via an inductance L, and flows to a bias terminal V2 (a ground in the drawing) via the variable-capacitance device C1. The dielectric constant of the variable-capacitance device C1 becomes a specified one according to a voltage applied to the variable-capacitance device C1, with the result that a desired capacitance component can be obtained. Since the variable-capacitance devices C2, C3, C4 and C5 are also connected to each other in parallel regarding a direct current via the first bias lines B11, B12 and B13 and the second bias lines B21, B22 and B23, bias signals of the same magnitude regarding a direct current are applied in the same way, and it is possible to obtain specified capacitance components.

As result, in the variable-capacitance capacitor Ct, direct current bias signals for controlling the capacitances of the variable-capacitance devices C1, C2, C3, C4 and C5 to desired values can be supplied to the variable-capacitance devices C1, C2, C3, C4 and C5 stably and separately, and dielectric constants in thin film dielectric layers of the variable-capacitance devices C1, C2, C3, C4 and C5 can be charged according to application of bias signals in a desired manner. Therefore, the variable-capacitance capacitor Ct whose capacitance components are easily controlled, is realized. Consequently, it is possible to shift phase by the variable-capacitance capacitor Ct, and it is possible to obtain a desired phase-shifting amount by the variable phase-shifting circuit P of the invention using the variable capacitance capacitor Ct.

Further, the high-frequency signals inputted to the variable-capacitance devices C1, C2, C3, C4 and C5 do not leak via the first bias lines B11, B12, B13 or the second bias lines B21, B22, B23, because the resistance component R11, R12 and R13 and the resistance components R21, R22 and R23 are high impedance components to an impedance in a frequency region of the high-frequency signals. Consequently, bias signals are independently applied to the variable-capacitance devices C1, C2, C3, C4 and C5 in a stable manner, with the result that it is possible to make the maximum use of the rates of capacitance changes of the respective variable-capacitance devices C1, C2, C3, C4 and C5 by bias signals.

That is, in the variable capacitance capacitor Ct, N variable capacitance devices (N is an integral number of two or more), here, the five variable-capacitance devices C1, C2, C3, C4 and C5 can be considered as variable-capacitance device connected to each other in series regarding a high frequency.

Accordingly, a high-frequency voltage applied to the variable capacitance devices C1, C2, C3, C4 and C5 connected to high other in series is divided and applied to the respective variable-capacitance devices C1, C2, C3, C4 and C5, so that the high-frequency voltages applied to the individual variable-capacitance devices C1, C2, C3, C4 and C5 become low. Consequently, it is possible to restrain a capacitance change to a high-frequency signal to be small, and it is possible, as a variable phase-shifting circuit, to suppress waveform distortion, intermodulation distortion and the like.

Further, since the variable-capacitance devices C1, C2, C3, C4 and C5 are connected to each other in series, the same effect as in the case of increasing the layer thickness of the dielectric layer of the capacitance device is obtained regarding a high frequency, so that it is possible to reduce a heat generation amount per unit volume by the loss resistance of the variable-capacitance capacitor, and it is possible, as a variable phase-shifting circuit, to increase electric high power handling capability.

In the case of using an odd number of variable-capacitance devices as in the variable-capacitance capacitor Ct shown in FIG. 13, it id possible to make a signal terminal of the variable-capacitance capacitor Ct and a bias terminal to be common, so that it is possible to operate equally with a general capacitor.

In an equivalent circuit view shown in FIG. 3, reference symbol I derives an input signal terminal, and reference symbol O denotes an output signal terminal. On the assumption that an input/output impedance $Z_0$ is 50Ω, reference numerals T1 and T3 denote λ/4 transmission lines having characteristic impedances of 35.4 Ω ($=Z_u \cdot \sqrt{2} = 50\Omega \sqrt{2}$), and reference numerals T2 and T4 denote λ/4 transmission lines having characteristics impedances of 50Ω ($=Z_0$). Reference symbol Ct denotes a variable-capacitance capacitor, and reference numerals L denote choke coils including RF blocking inductance components for supplying control voltages (bias signals) A 90-degree hybrid circuit is composed of λ/4 transmission lines T1, T2, T3, and T4, and a reflective type of variable phase-shifting circuit is realized. A direct current restriction capacitance device is omitted.

In an equivalent circuit view of FIG. 13, on the assumption that a frequency of an input signal is f and an initial value of the variable-capacitance capacitor Ct is $Ct_1$, a phase of an output signal changes by a phase $\theta_1 = 2\tan^{-1}(1/(Z_0 \cdot 2\pi f \cdot Ct_1))$ with respect to the phase of the input signal. Moreover, when the capacitance value of the variable-capacitance capacitor Ct is regulated to $Ct_2$ by an applied voltage, a phase of an output signal changes by a phase $\theta_2 = 2\tan^{-1}(1/(Z_0 \cdot 2\pi f \cdot Ct_2))$ with respect to the phase of the input signal. By regulating the capacitance value of the variable-capacitance capacitor Ct, a phase change (a phase-shifting amount) θ becomes $\theta_1-\theta_2=2\tan^{-1}(1/(Z_0 \cdot 2\pi f \cdot Ct_1))-2\tan^{-1}(1/(Z_0 \cdot 2\pi f \cdot Ct_2))$. That is, only by regulating the capacitance value of the variable-capacitance capacitor Ct by an applied voltage, it is possible to vary the phase-shifting amount of a variable phase-shifting circuit P to a desired phase-shifting amount.

Although one example of the phase-shifting circuit P of the invention is shown here, it is possible to use the variable phase shifting circuit P by changing the structure thereof according to objects within the scope of the invention, for example, to a loaded line typo using transmission lines, distributed coupling and directional coupling type, a 180-degree hybrid type, and circulator.

An example of a method for producing the variable-capacitance capacitor Ct composing the variable phase-shifting circuit P of the invention is same as the variable-capacitance capacitor Ct of the first embodiment, and the description will be emitted will be described.

Figure 14:
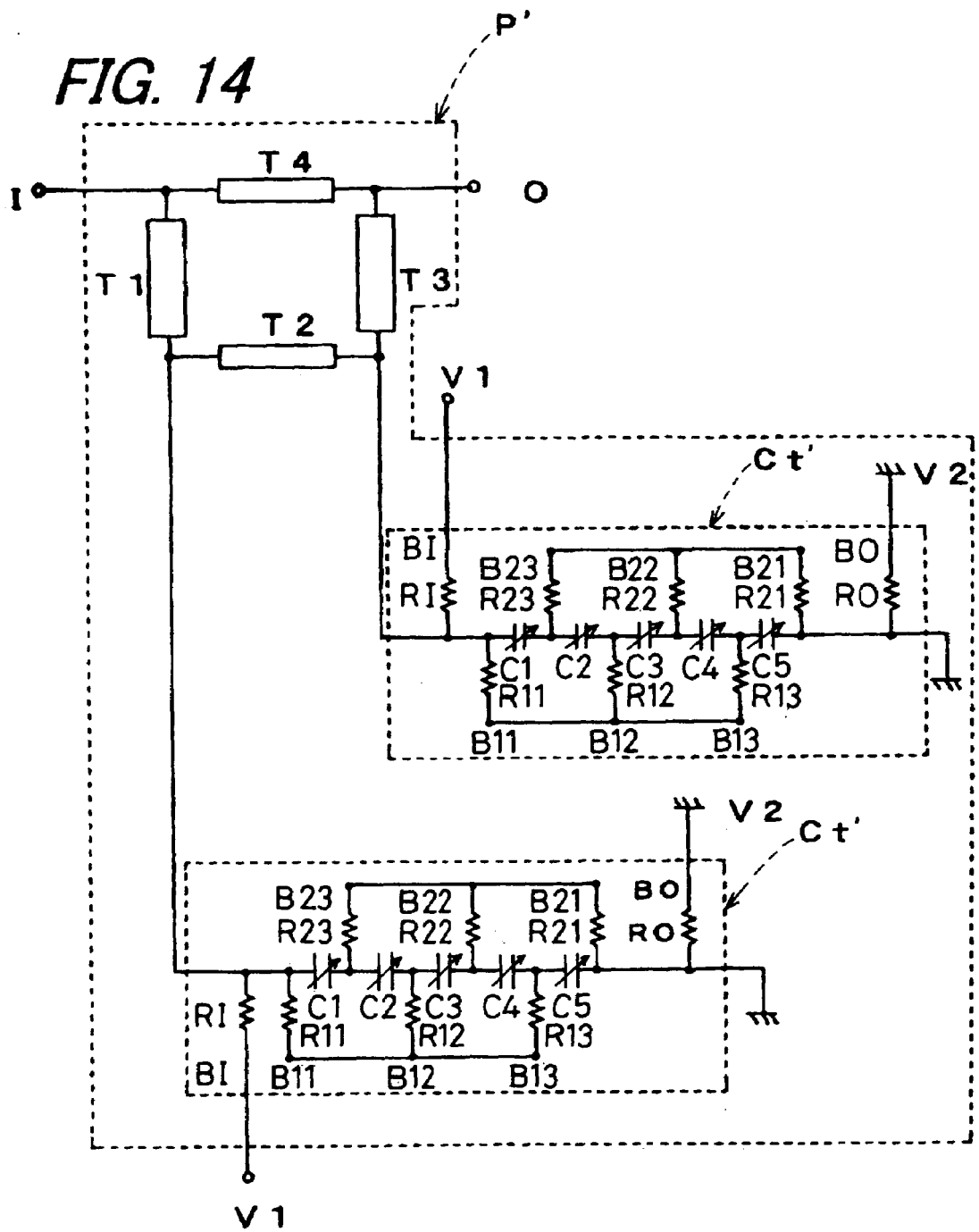
FIG. 14 is an equivalent circuit view showing a variable phase-shifting circuit according to an eighth embodiment of the invention.

Next, FIG. 14 shows a variable phase-shifting circuit according to an eighth embodiment of the invention. FIG. 14 is an equivalent circuit view of a 90-degree hybrid variable phase-shifting circuit P' that uses a variable-capacitance capacitor having a bias supply circuit and having five variable-capacitance devices. In the equivalent circuit view shown in FIG. 14, reference numerals C1, C2, C3, C4 and C5 denote variable-capacitance devices, reference numerals B11, B12 and B13 denote first bias lines including at least one of resistance components and inductor components (resistance components R11, R12 and R13 are shown in the drawing), and reference numerals B21, B22 and B23 denote second bias lines including at least one of resistance components and inductor components (resistance components R21, R22 and R23 are shown in the drawing), and reference symbols BI and BO denote first and second common bias lines serving as bias supply circuits including at least one of resistance components and inductor components, respectively (resistance components RI and RO are shown in the drawing). Moreover, reference numeral V1 denotes a first bias terminal, that is, a terminal on a side to which a bias signal is supplied, and reference numeral V2 denotes a second bias terminal, that is, a terminal that bias signals applied to the variable-capacitance devices C1, C2, C3, C4 and C5 fall on the grounding side.

In a variable-capacitance capacitor Ct' having such a structure, between an input terminal and an output terminal of the variable-capacitance capacitor Ct', high-frequency signals flow via the variable-capacitance devices C1 to C5 connected to each other in series. At this moment, the resistance components R11, R12 and R13 of the first bias lines B11, B12 and B13 and the resistance components R21, R22 and R23 of the second bias lines B21, B22 and B23 are high impedance components to an impedance in a frequency region of the high-frequency signals of the variable-capacitance devices C1 to C5, and have no adverse effects on the impedance of the high-frequency band.

Further, the resistance component RI of the first common bias line BI and the resistance component RU of the second common bias line BO are high impedance components to an impedance in a frequency region of high-frequency signals of synthetic capacitance of the variable-capacitance devices C1 to C5, and have no adverse effects on the impedance of the high-frequency band.

Still further, a bias signal that controls a capacitance component of the variable-capacitance capacitor Ct' is supplied from the first bias terminal V1, and flows to the second bias terminal V2 (a ground in FIG. 14) via the variable-capacitance device C1. The dielectric constant of the variable capacitance device C1 becomes a specified one according to a voltage applied to the variable-capacitance device C1, with the result that a desired capacitance component can be obtained. The same applies to the variable-capacitance devices C2 to C5.

As a result, in the variable-capacitance capacitor Ct', bias signals for controlling the capacitance of the variable-capacitance devices C1 to C5 to desired values can be supplied to the variable-capacitance devices C1 to C5 stably and separately, and the dielectric constants in the thin film dielectric layers of the variable-capacitance devices C1 to C5 can be changed by application at bias signal in a desired manner. Therefore, the variable-capacitance capacitor Ct' whose capacitance components are easily controlled, is realized. Consequently, it is possible to obtain a desired phase-shifting amount by the variable-capacitance capacitor Ct', and it is possible to vary the phase-shifting amount in a desired manner by the variable phase-shifting circuit P' of the invention using the variable-capacitance capacitor Ct'.

That is, high-frequency signals of the variable-capacitance devices C1 to C5 do not leak via the first bias lines B11, B12, B13, the second bias lines B21, B22, B23 or the resistance component RI of the first common bias line BI and the resistance component BO of the second common bias line BO. Consequently, bias signals are applied to the variable-capacitance devices C1 to C5 stably and independently, with the result that it is possible to make the maximum use of the rates of capacitance changes of the respective variable-capacitance devices C1 to C5 by bias signals.

Further, in the variable-capacitance capacitor Ct', N variable-capacitance devices (N is an integral number of 2 or more), here, the five variable-capacitance devices C1 to C5 can be considered as variable-capacitance devices connected to each other in series regarding a high frequency.

Therefore, a high-frequency voltage applied to the variable-capacitance devices connected to each other in series is divided and applied to the respective variable-capacitance devices C1 to C5, so that the high-frequency voltages applied to the individual variable-capacitance devices C1 to C5 become low. Thus, it is possible to restrain capacitance changes to high-frequency signals in the individual variable-capacitance devices C1 to C5 to be small, and it is possible, as the variable phase-shifting circuit P' using the variable-capacitance capacitor Ct' having the variable-capacitance devices C1 to C5, to suppress waveform distortion, intermodulation distortion and the like.

Further, since the variable-capacitance devices C1 to C5 are connected to each other in series, the same effect as in the case of increasing the thickness of the dielectric layer can be obtained regarding a high frequency, it is possible to reduce a heat generation amount per unit volume by the loss resistance of the variable-capacitance capacitor Ct', and it is possible to increase the electric high power handling capability of the variable phase-shifting circuit P'.

Still further, since the variable-capacitance capacitor Ct' has the bias supply circuit, an external bias supply circuit used conventionally is not necessary, so that a variable phase-shifting circuit P' that is small-sized and very easy to operate is realized.

In the case of grounding the V2 to the ground, there is no need to always dispose a second common bias line BO. Moreover, the direct current restriction capacitance device is omitted.

A method for producing the variable capacitance capacitor Ct' in this embodiment is same as the variable-capacitance capacitor Ct' of the second embodiment, and the description will be emitted.

Figure 15:
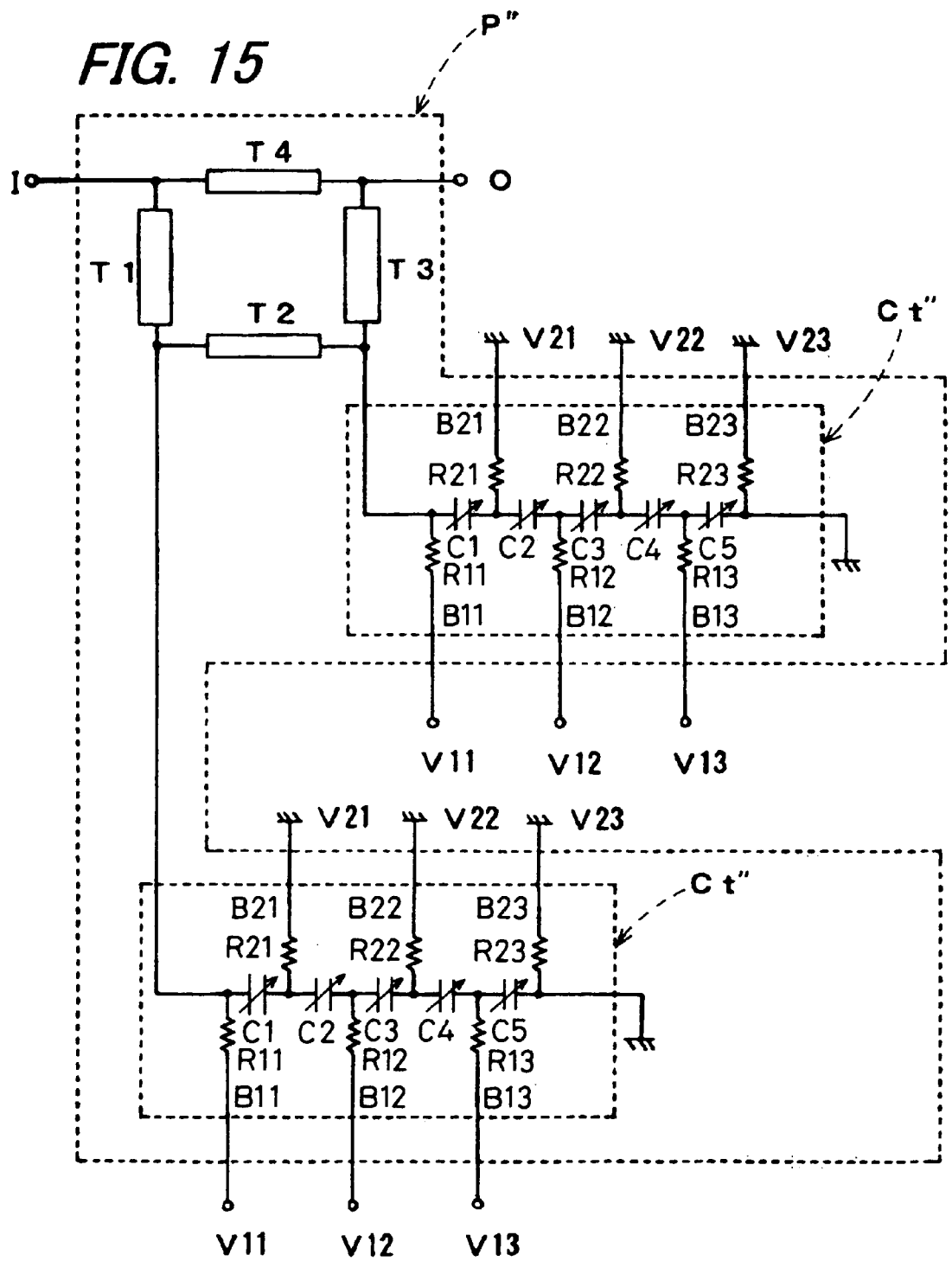
FIG. 15 is an equivalent circuit view showing a variable phase-shifting circuit according to a ninth embodiment of the invention with bias supply circuits disposed individually.

The invention is not restricted to the embodiments described above, and there is nothing against adding various changes within the scope of the invention. For example, although the first and seecond common bias lines BI and BO serving as bias supply circuits are common in the aforementioned embodiment, a variable phase shifting circuit P''' according to a ninth embodiment of the invention may have a variable-capacitance capacitor Ct'' formed in a manner that the bias lines B11, B12, B13, B21, B22 and B23 serving as bias supply circuits are individually disposed to the variable-capacitance devices C1, C2, C3, C4 and C5 as shown in an equivalent circuit view of FIG. 15.

Further, although a variable phase shifting circuit of a microwave band and a millimeter-wave band is described in the above embodiment, the variable phase-shifting circuit may be used for a delay circuit that changes the phase of an input signal and outputs and that are used in a phase modulation circuit and a digital circuit.

In the following, a variable attenuation circuit of the invention will be described in detail with reference to the drawings.

Figure 16:
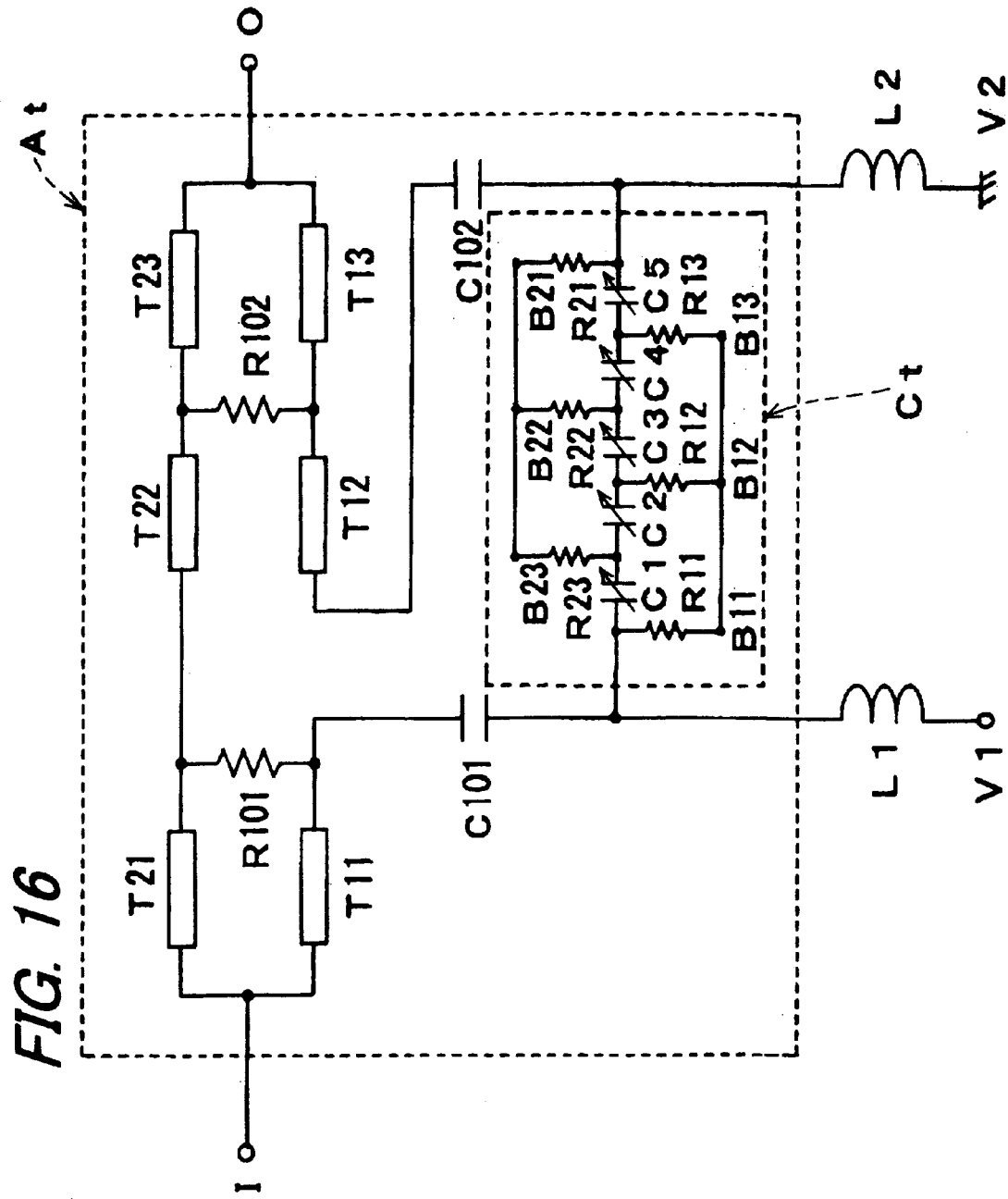
FIG. 16 is an equivalent circuit view showing a variable attenuation circuit according to a tenth embodiment of the invention.

FIG. 16 shows a variable attenuation circuit according to a tenth embodiment of the invention. FIG. 16 is an equivalent circuit view of a variable attenuation circuit At provided with a Wilkinson type distributor and synthesizer, and a variable-capacitance capacitor which is inserted into one of distributed paths and has five variable-capacitance devices.

In the equivalent circuit view shown in FIG. 16, reference numerals C1, C2, C3, C4 and C5 denote variable-capacitance devices, reference numerals B11, B12 and B13 denote first bias lines including at least one of resistance components and inductor components (resistance components R11, R12 and R13 are shown in the drawing), and reference numerals B21, B22 and B23 denote second bias lines including at least one of resistance components and an inductor components (resistance components R21, R22 and R23 are shown in the drawing).

In a variable-capacitance capacitor Ct having such a structure, between an input terminal and an output terminal of the variable-capacitance capacitor Ct, high-frequency signals flow via variable-capacitance devices C1, C2, C3, C4 and C5 connected to each other in series. At this moment, resistance components R11, R12 and R13 of first bias lines B11, B12 and B13 and resistance components R21, R22 and R23 of second bias lines B21, B22 and B23 are high impedance components to an impedance in a frequency region of the high-frequency signals of the variable-capacitance devices C1, C2, C3, C4 and C5, and have no adverse effects on the impedance of the high-frequency bands.

Further, a bias signal that controls a capacitance component of the variable-capacitance device C1 is supplied from a bias terminal V1 via an inductance L, and flows to a bias terminal V2 (a ground in the drawing) via the variable capacitance device C1. The dielectric constant of the variable-capacitance device C1 becomes a specified one according to a voltage applied to the variable-capacitance device C1, with the result that a desired capacitance component can be obtained. Since the variable-capacitance devices C2, C3, C4 and C5 are connected to each other in parallel regarding a direct current via the first bias lines B11, B12 and B13 and the second bias lines B21, B22 and B23, the same magnitude of bias signals are applied regarding a direct current in the same way, and specified capacitance components can be obtained.

An a result, in the variable-capacitance capacitor Ct, direct current bias signals for controlling the capacitance of the variable-capacitance devices C1, C2, C3, C4 and C5 to desired values can be supplied to the variable-capacitance devices C1, C2, C3, C4 and C5 stably and separately, and dielectric constants in thin film dielectric layers of the variable-capacitance devices C1, C2, C3, C4 and C5 can be changed by application of bias signals in a desired manner. Therefore, the variable-capacitance capacitor Ct whose capacitance components are easily controlled, is realized. Consequently, it is possible to regulate a phase by the variable-capacitance capacitor Ct, and it is possible to obtain a desired attenuation amount by a variable attenuation circuit At of the invention using the variable-capacitance capacitor.

Further, high-frequency signals inputted to the variable-capacitance devices C1, C2, C3, C4 and C5 do not leak via the first bias lines B11, B12, B13 or the second bias lines B21, B22, B23, because the resistance components R11, R12 and R13 and the resistance components R21, R22 and R23 are high impedance components to an impedance in a frequency region of the high-frequency signals. Consequently, bias signals are independently applied to the variable-capacitance devices C1, C2, C3, C4 and C5 in a stable manner, with the result that it is possible to make the maximum use of the rates of capacitance changes of the respective variable-capacitance devices C1, C2, C3, C4 and C5 by bias signals.

That is, in the variable-capacitance capacitor Ct, N variable-capacitance devices (N is an integral number of two or more), here, the five variable-capacitance devices C1, C2, C3, C4 and C5 can be considered as variable-capacitance devices connected to each other in series regarding a high frequency.

Accordingly, a high-frequency voltage applied to the variable-capacitance devices C1, C2, C3, C4 and C5 connected to each other in series is divided and applied to the respective variable-capacitance devices C1, C2, C3, C4 and C5, so that the high-frequency voltages applied to the individual variable-capacitance devices C1, C2, C3, C4 and C5 become low. Consequently, it is possible to restrain a capacitance change to a high-frequency signal to be small, and it is possible, as a variable attenuation circuit, to suppress waveform distortion, intermodulation distortion and the like.

Further, since the variable-capacitance devices C1, C2, C3, C4 and C5 are connected to each other in series, the same effect as in the case of increasing the layer thickness of the dielectric layer of the capacitance devices is obtained regarding a high frequency, so that it is possible to reduce a heat generation amount per unit volume by the loss resistance of the variable capacitance capacitor, and it is possible, as a variable attenuation circuit, to increase electric high power handling capability.

In the case of using an odd number of variable-capacitance devices as in the variable-capacitance capacitor Ct shown in FIG. 16, it is possible to make a signal terminal of the variable-capacitance capacitor Ct and a bias terminal to be common, so that it is possible to operate equally with a general capacitor.

In an equivalent circuit view shown in FIG. 16, reference symbol I denotes an input signal terminal, and reference symbol O denotes an output signal terminal. On the assumption that an input/output impedance $Z_0$ is 50Ω, reference numerals T11, T13, T21 and T23 denote λ/4 transmission lines having characteristic impedances of 70.7 Ω ($=Z_0\cdot\sqrt{2}=50\Omega\cdot\sqrt{2}$), reference numerals R101 and R102 denote resistance of 100 Ω ($=Z_0\cdot2=50\ \Omega\cdot2$), and reference numerals T12 and T22 denote transmission lines having characteristic impedance of 50Ω ($=Z_0$). Reference symbol Ct denotes a variable-capacitance capacitor, reference numerals L1 and L2 denote choke coils including RF blocking inductance components for supplying control voltages (bias signals), and reference numerals C101 and C102 denote direct current restriction capacitance devices. These components compose a variable attenuation circuit At.

The λ/4 transmission lines T11 and T21 and the resistor R101 compose a distributor, which equally distributes input signals to a path from T11 to T13 (refer to a T1 path hereinafter) and a path from T21 to T23 (refer to a T2 path hereinafter). Moreover, the λ/4 transmission lines T13, T23 and the resistor R102 compose a synthesizer. It is possible, by regulating the capacitance of the variable-capacitance capacitor Ct in the T1 path by an applied voltage, to regulate a phase of a T1 output signal passed through the T1 path, so that the variable attenuation circuit At that attenuates the level of a synthesized output signal to a desired level by a phase difference between the T1 output signal and a T2 output signal passed through the T2 path, is realized. That is, it is possible, only by regulating the capacitance value of the variable capacitance capacitor Ct by an applied voltage, to change an attenuation amount of a signal by the variable attenuation circuit At to a desired attenuation amount.

For example, in the equivalent circuit view of FIG. 16, on the assumption that the electrical lengths of the λ/4 transmission lines T12 and T22 are the same and the initial value of the variable-capacitance capacitor Ct such that the electrical length of the T1 path and the electrical length of the T2 path become equal to each other is $Ct_1$, the T1 output signal and the T2 output signal have no phase difference (i.e., these outputs signals are in phase), so that an output signal does not attenuate (i.e., this attenuation amount is the minimum attenuation amount). On the contrary, when the capacitance value of the variable capacitance capacitor Ct is regulated to $Ct_2$ by an applied voltage, a phase difference between the T1 output signal and the T2 output signal is generated, so that the attenuation amount changes (i.e., increases) according to an applied voltage.

Further, in the equivalent circuit view of FIG. 16, on the assumption that a difference in electrical lengths between λ/4 transmission lines T12 and T22 is λ/2 and the initial value of the variable-capacitance capacitor Ct such that a difference between the electrical length of the T1 path and the electrical length of the T2 path becomes λ/2 is $Ct_1$, the T1 output signal and the T2 output signal have a phase difference of 180 degrees (i.e., these output signals are in reversed phase), so that an output signal largely attenuates (i.e., this attenuation amount is the maximum attenuation amount). When the capacitance value of the variable-capacitance capacitor Ct is regulated to $Ct_3$ by an applied voltage, a phase difference between the T1 output signal and the T2 output signal decreases, so that the attenuation amount changes (i.e., decreases) according to an applied voltage, and consequently, a function as the variable attenuation circuit At is obtained.

Depending on a desired attenuation amount, the lengths of the transmission lines T12 and T22 may be regulated in a manner that the attenuation amount can be obtained by the variable attenuation circuit At.

Although an embodiment of the attenuation circuit At of the invention is shown here, the variable attenuation circuit At can be used by changing the structure thereof according to objects within the scope of the invention, for example, to a structure such that the variable-capacitance capacitor Ct is connected between a transmission line and a ground, a structure such that the variable-capacitance capacitor is connected in parallel to a transmission line, and a multistage structure.

An example of a method for producing the variable-capacitance capacitor Ct composing the variable attenuation circuit At of the invention is same as the variable-capacitance capacitor Ct of the first embodiment, and the description will be emitted.

Figure 17:
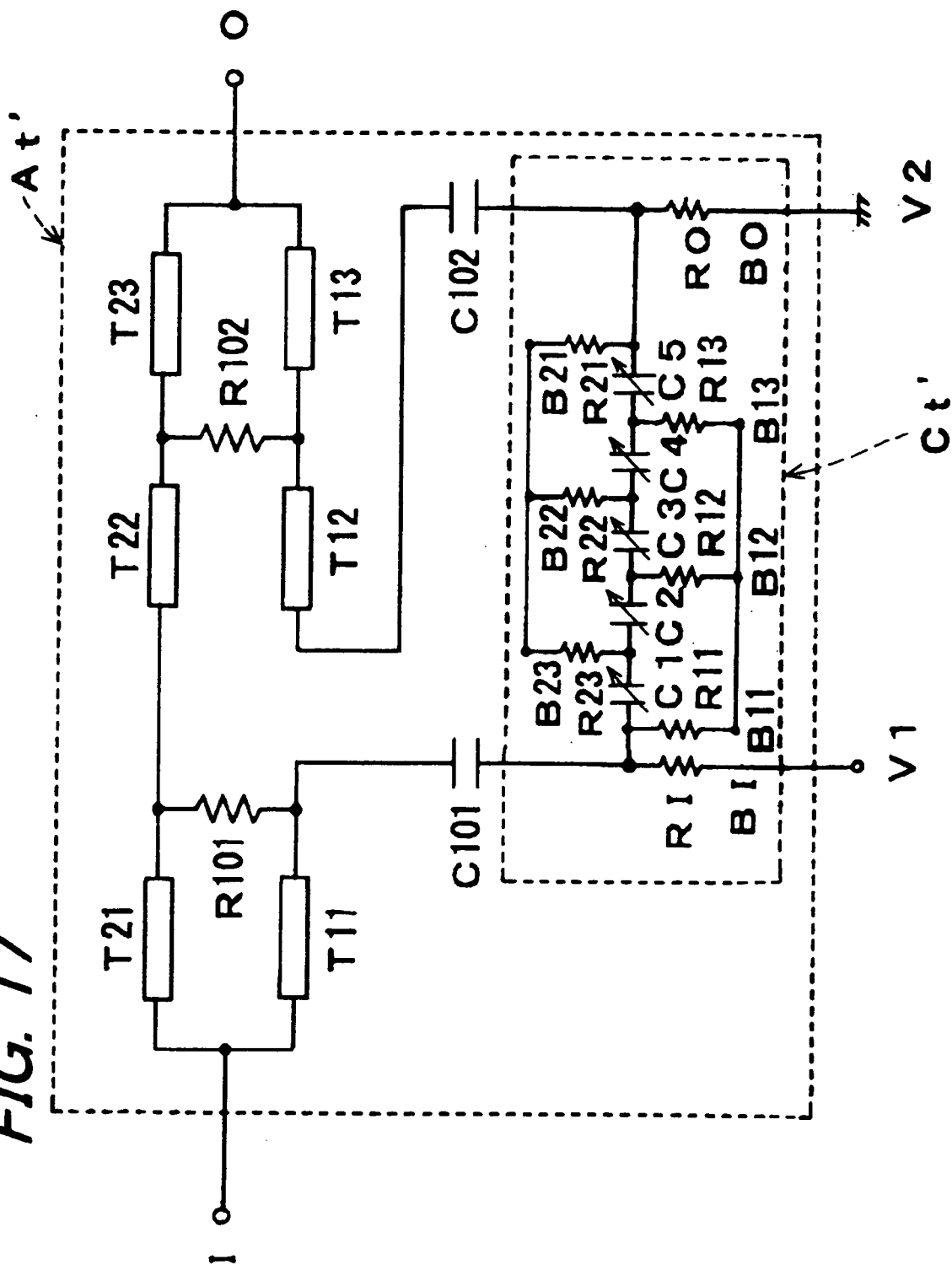
FIG. 17 is an equivalent circuit view showing a variable attenuation circuit according to an eleventh embodiment of the invention.

Next, FIG. 17 shows a variable attenuation circuit according to an eleventh embodiment of the invention. FIG. 17 is an equivalent circuit view of a variable attenuation circuit At' provided with a Wilkinson type distributor and synthesizer, and a variable-capacitance capacitor which is inserted into one of distribution paths, has a bias supply circuit and has five variable-capacitance devices.

In the equivalent circuit view shown in FIG. 17, reference numerals C1, C2, C3, C4 and C5 denote variable-capacitance devices, reference numerals B11, B12 and B13 denote first bias lines including at least one of resistance components and inductor components (resistance components R11, R12 and R13 are shown in the drawing), and reference numerals B21, B22 and B23 denote second bias lines including at least one of resistance components and inductor components (resistance components R21, R22 and R23 are shown in the drawing)) and reference symbols BI and BO denote first and second common bias lines serving as bias supply circuits including at least one of resistance components and inductor components, respectively (resistance components RI and RO are shown in the drawing). Moreover, reference numeral V1 denotes a first bias terminal, that is, a terminal on a side to which a bias signal is supplied, and reference numeral V2 denotes a second bias terminal, that is, a terminal that bias signals applied to the variable-capacitance devices C1, C2, C3, C4 and C5 fall on the grounding side.

In a variable-capacitance capacitor Ct' having such a structure, between an input terminal and an output terminal of the variable-capacitance capacitor Ct', high-frequency signals flow via the variable-capacitance devices C1 to C5 connected to each other in series. At this moment, the resistance components R11, R12 and R13 of the first bias lines B11, B12 and B13 and the resistance components R21, R22 and R23 of the second bias lines B21, B22 and B23 are high impedance components to an impedance in a frequency region of the high-frequency signals of the variable-capacitance devices C1 to C5, and have no adverse effects on the impedance of the high-frequency band.

Further, the resistance component RI of the first common bias line BI and the resistance component RO of the second common bias line BO are high impedance components to an impedance in a frequency region of high-frequency signals of synthetic capacitance of the variable-capacitance devices C1 to C5, and have no adverse effects on the impedance of the high-frequency band.

Still further, a bias signal that controls a capacitance component of the variable-capacitance capacitor Ct' is supplied from the first bias terminal V1, and flows to the second bias terminal V2 (a ground in FIG. 17) via the variable-capacitance device C1. The dielectric constant of the variable-capacitance device C1 becomes a specified one according to a voltage applied to the variable-capacitance device C1, with the result that a desired capacitance component can be obtained. The same applies to the variable-capacitance devices C2 to C5.

As a result, in the variable-capacitance capacitor Ct', bias signals for controlling the capacitance of the variable-capacitance devices C1 to C5 to desired values can be supplied to the variable-capacitance devices C1 to C5 stably and separately, and the dielectric constants in the thin film dielectric layers of the variable-capacitance devices C1 to C5 can be changed by application of bias signals in a desired manner. Therefore, the variable capacitance capacitor Ct' whose capacitance components are easily controlled, is realized. Consequently, it is possible to set to a desired attenuation amount by the variable-capacitance capacitor Ct' in a desired manner, and it is possible to match with a desired attenuation amount by the variable attenuation circuit At' of the invention using the variable-capacitance capacitor.

That is, high-frequency signals of the variable-capacitance devices C1 to C5 do not leak via the first bias lines B11, B12, B13, the second bias lines B21, B22, B23 or the resistance component RI of the first common bias line BI and the resistance component RO of the second common bias line BO. Consequently, bias signals are applied to the variable-capacitance devices C1 to C5 stably and independently, with the result that it is possible to make the maximum use of the rates of capacitance changes of the respective variable-capacitance devices C1 to C5 by bias signals.

Further, in the variable-capacitance capacitor Ct', N variable-capacitance devices (N is an integral number of 2 or more), here, the five variable-capacitance devices C1 to C5 can be considered as variable-capacitance devices connected to each other in series regarding a high frequency.

Therefore, a high frequency voltage applied to the variable-capacitance devices connected to each other in series is divided and applied to the respective variable-capacitance devices C1 to C5, so that the high-frequency voltages applied to the individual variable-capacitance devices C1 to C5 become low. Thus, it is possible to restrain capacitance changes to high-frequency signals in the individual variable-capacitance devices C1 to C5 to be small, and it is possible, as the variable attenuation circuit At' using the variable-capacitance capacitor Ct' having the variable-capacitance devices C1 to C5, to suppress waveform distortion, intermodulation distortion and the like.

Further, since the variable-capacitance devices C1 to C5 are connected to each other in series, the same effect as in the case of increasing the thickness of the dielectric layer can be obtained regarding a high frequency, it is possible to reduce a heat generation amount per unit volume by the loss resistance of the variable-capacitance capacitor Ct', and it is possible to increase the electric high power handling capability of the variable attenuation circuit At'.

Still further, since the variable-capacitance capacitor Ct' has the bias supply circuit, an external bias supply circuit used conventionally is not necessary, so that a variable attenuation circuit At' that is small-sized and very easy to operate is realized.

In the case of grounding the V2 to the ground, there is no need to always dispose a second common bias line BO. Moreover, the direct current restriction capacitance device is omitted.

A method for producing the variable-capacitance capacitor Ct' in this embodiment is same as the variable-capacitance capacitor Ct' of the second embodiment, and the description will be emitted.

Figure 18:
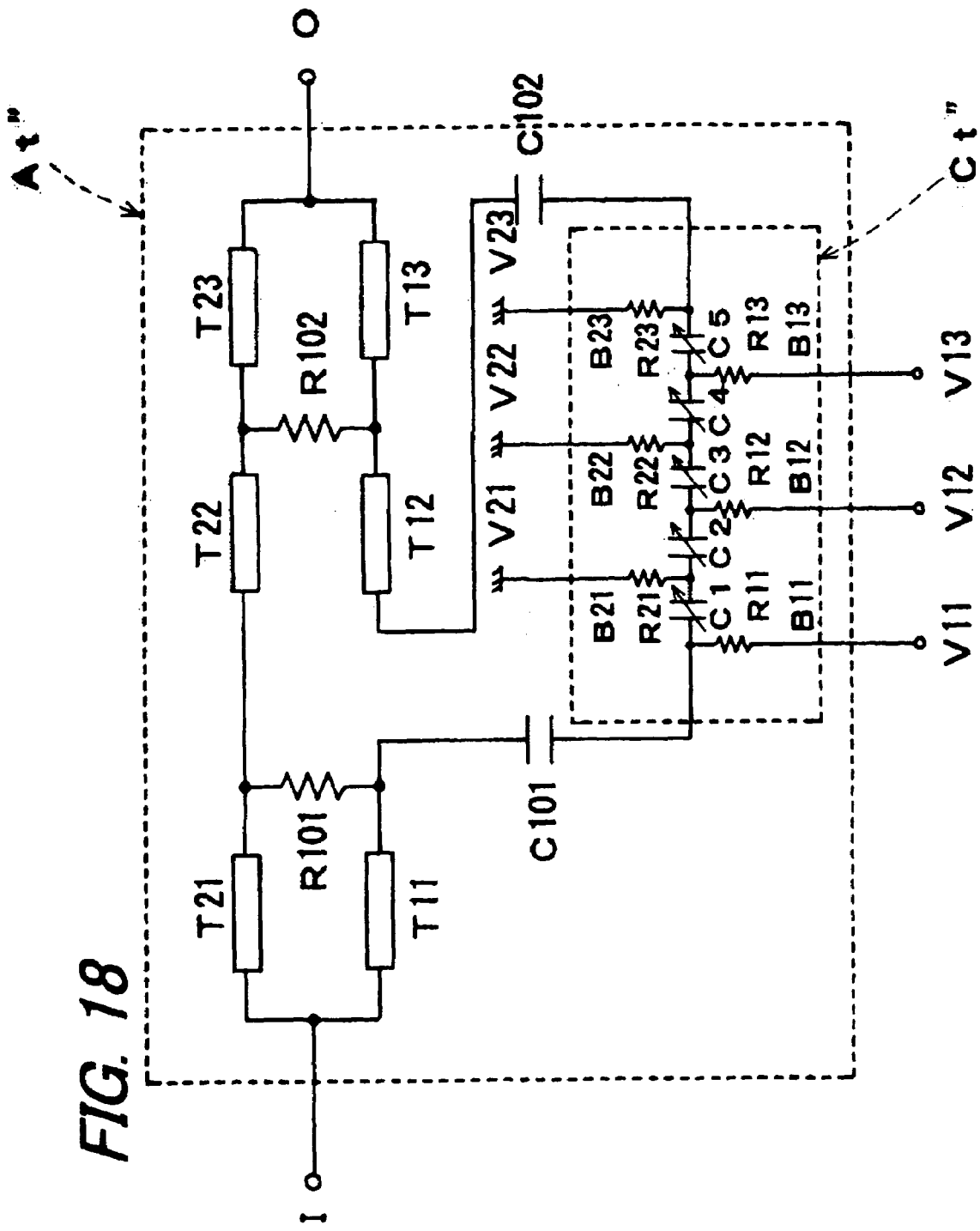
FIG. 18 is an equivalent circuit view showing a variable attenuation circuit according to a twelfth embodiment of the invention with bias supply circuits disposed individually.
Figure 19:
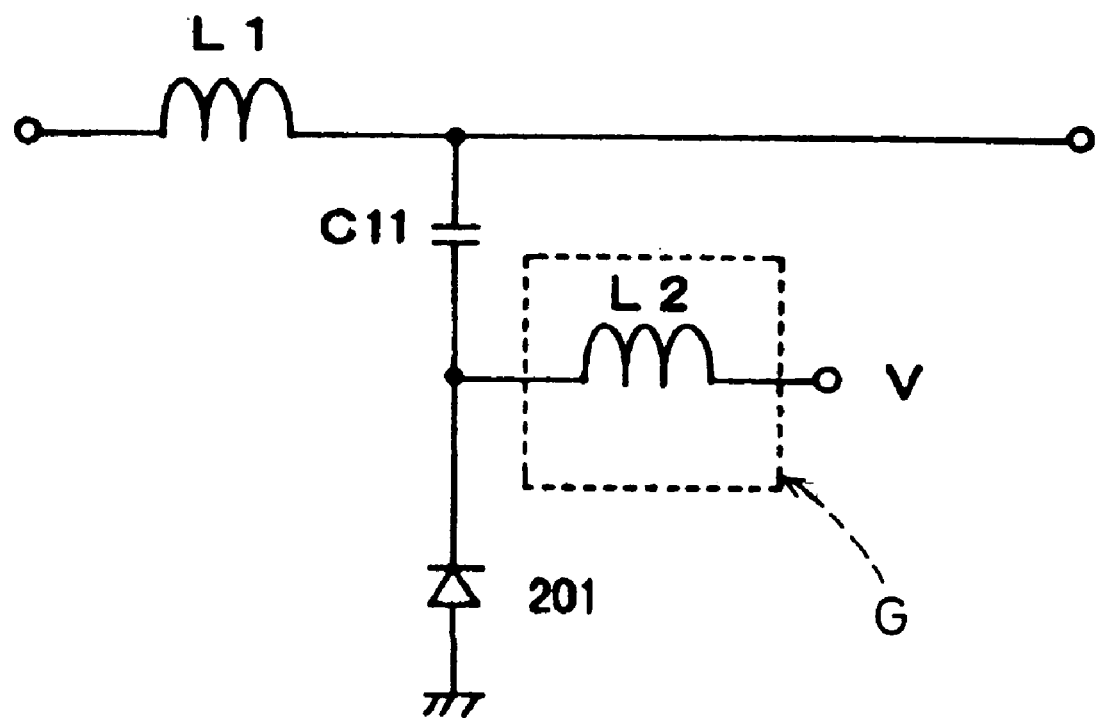
FIG. 19 is an equivalent circuit view showing an example of a conventional variable matching circuit.
Figure 20:
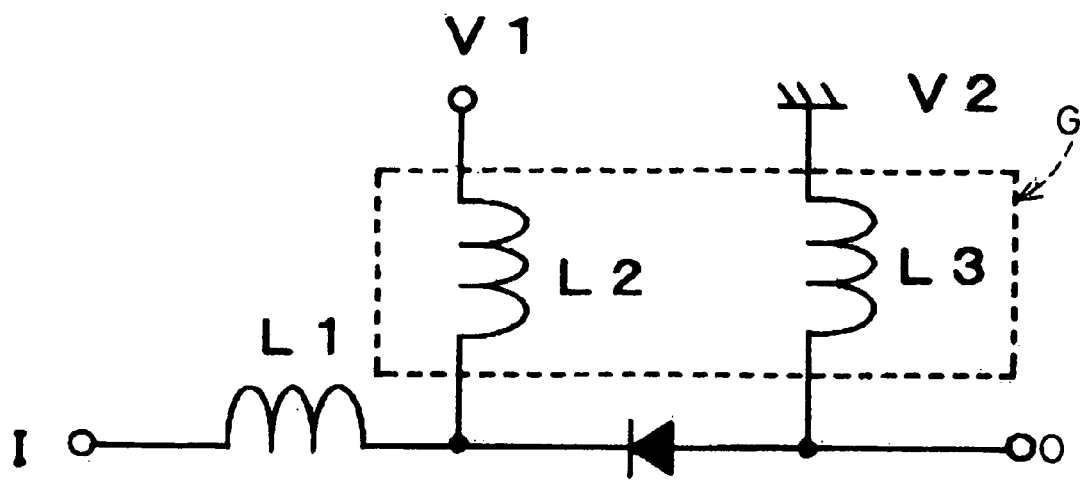
FIG. 20 is an equivalent circuit view showing an example of a conventional variable resonance circuit.
Figure 21:
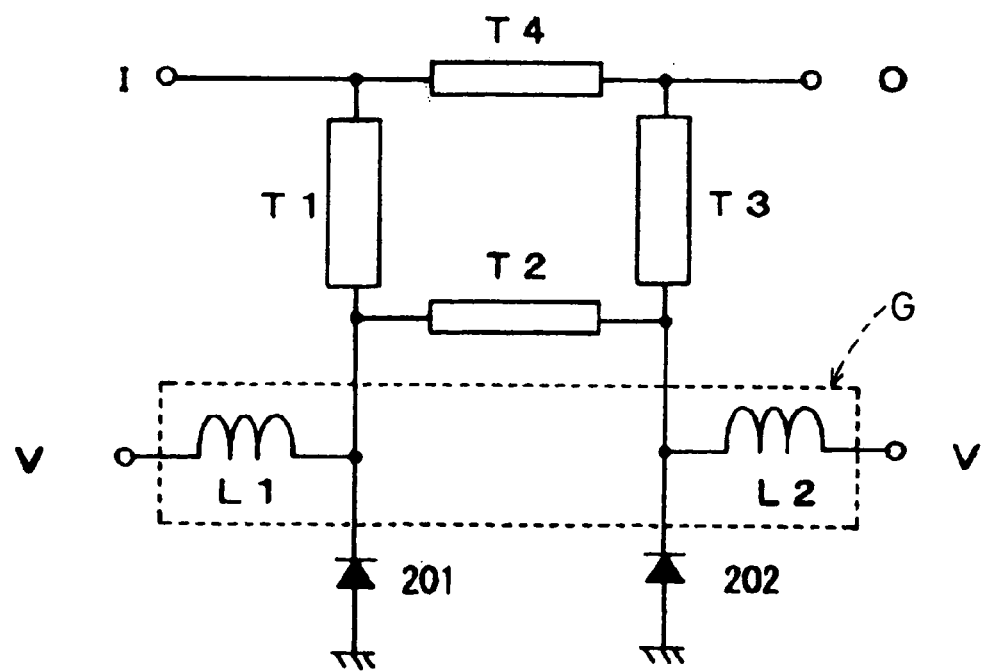
FIG. 21 is an equivalent circuit view showing an example of a conventional variable phase-shifting circuit.
Figure 22:
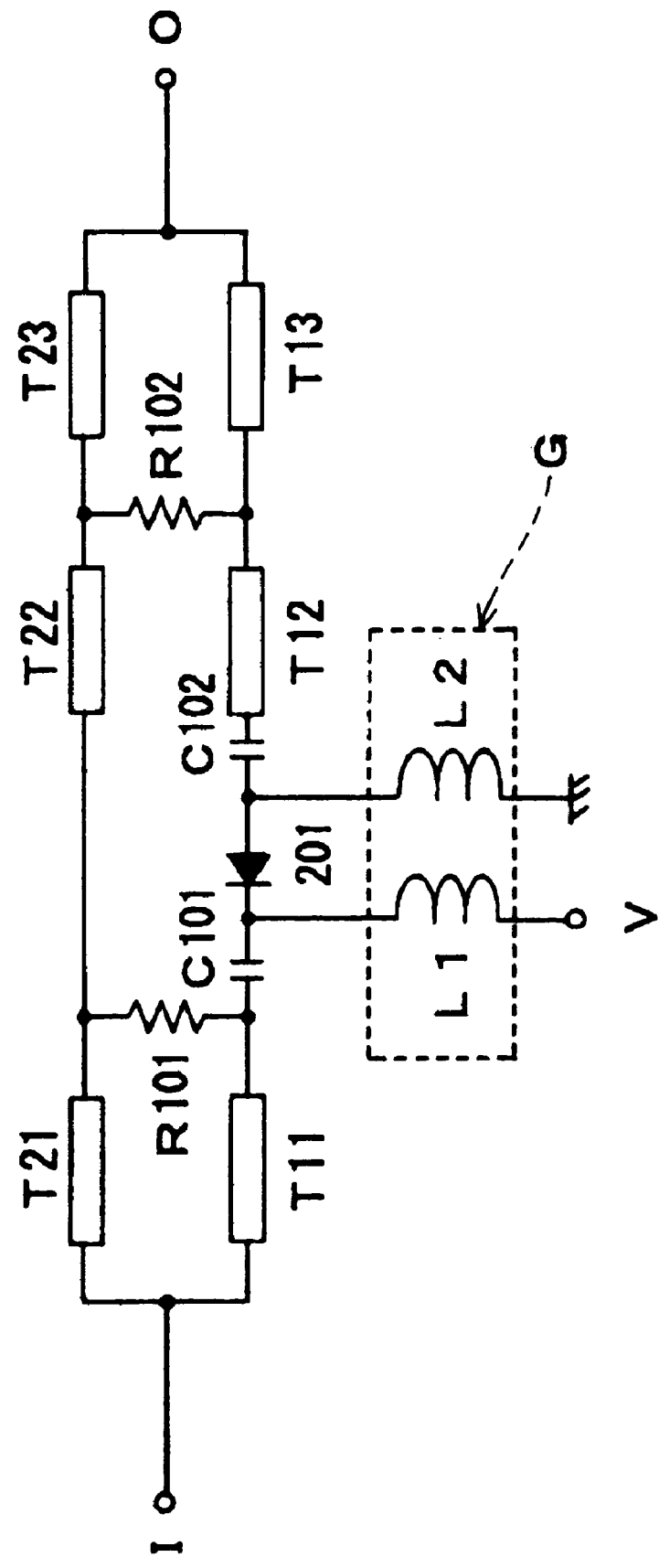
FIG. 22 is an equivalent circuit view showing an example of a conventional variable attenuation circuit.

The invention is not restricted to the embodiments described above, and there is nothing against adding various changes within the scope of the invention. For example, although the first and second common bias lines BI and BO serving as a bias supply circuit are made to be common in the aforementioned embodiment, a variable attenuation circuit At'' according to a twelfth embodiment of the invention may have a variable-capacitance capacitor Ct'' formed in a manner that the bias lines B11, B12, B13, B21, B22 and B23 serving as a bias supply circuit are individually disposed to the respective variable-capacitance devices C1, C2, C3, C4 and C5 as shown an equivalent circuit view in FIG. 18.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A variable matching circuit, comprising:
   an impedance device; and
   a variable-capacitance capacitor,
   wherein the variable-capacitance capacitor is formed in a manner that a plurality of variable-capacitance devices using thin film dielectric layers whose dielectric constants change depending on applied voltages are connected to each other in parallel regarding a direct current bias and connected to each other in series regarding a high frequency signal, between an input terminal and an output terminal, and is supplied with both the high frequency signal and the direct current bias from the input terminal.

2. The variable matching circuit of claim 1, wherein the variable-capacitance capacitor has a bias supply circuit which is connected to electrodes of the plurality of variable-capacitance devices and includes at least one of a resistance component and an inductor component.

3. The variable matching circuit of claim 1, wherein the plurality of variable-capacitance devices consist of an odd number of variable-capacitance devices, and the variable-capacitance capacitor is formed in a manner that the odd number of variable-capacitance devices are connected to each other in parallel regarding a direct current bias and connected to each other in series regarding a high frequency signal.

* * * * *